(12) United States Patent
Popoff et al.

(10) Patent No.: US 7,602,645 B2
(45) Date of Patent: *Oct. 13, 2009

(54) METHOD AND APPARATUS FOR VARYING THE PROGRAMMING DURATION AND/OR VOLTAGE OF AN ELECTRICALLY FLOATING BODY TRANSISTOR, AND MEMORY CELL ARRAY IMPLEMENTING SAME

(75) Inventors: Gregory Allan Popoff, Lausanne (CH); Paul de Champs, Prévessin-Moens (FR); Hamid Daghighian, Geneva (CH)

(73) Assignee: Innovative Silicon ISi SA, Lausanne (CH)

( * ) Notice: Subject to any disclaimer, the term of this patent is extended or adjusted under 35 U.S.C. 154(b) by 0 days.

This patent is subject to a terminal disclaimer.

(21) Appl. No.: 12/284,961

(22) Filed: Sep. 26, 2008

(65) Prior Publication Data
US 2009/0034350 A1   Feb. 5, 2009

Related U.S. Application Data

(63) Continuation of application No. 11/590,147, filed on Oct. 31, 2006, now Pat. No. 7,436,706.

(60) Provisional application No. 60/731,668, filed on Oct. 31, 2005, provisional application No. 60/736,613, filed on Nov. 15, 2005.

(51) Int. Cl.
*G11C 16/04* (2006.01)

(52) U.S. Cl. .............................. 365/185.14; 365/185.26; 365/189.04

(58) Field of Classification Search ............ 365/185.18, 365/185.26, 189.04, 189.08
See application file for complete search history.

(56) References Cited

U.S. PATENT DOCUMENTS

| 5,629,898 | A | 5/1997 | Idei et al. |
| 5,822,264 | A | 10/1998 | Tomishima et al. |
| 7,085,153 | B2 * | 8/2006 | Ferrant et al. ............... 365/149 |
| 7,251,164 | B2 | 7/2007 | Okhonin et al. |
| 7,301,803 | B2 | 11/2007 | Okhonin et al. |
| 7,436,706 | B2 | 10/2008 | Popoff et al. |
| 7,483,296 | B2 * | 1/2009 | Bedeschi et al. ............ 365/175 |
| 7,499,352 | B2 * | 3/2009 | Singh ......................... 365/200 |

* cited by examiner

*Primary Examiner*—Tuan T Nguyen
*Assistant Examiner*—Hien N Nguyen
(74) *Attorney, Agent, or Firm*—Neil A. Steinberg

(57) ABSTRACT

There are many inventions described herein as well as many aspects and embodiments of those inventions, for example, circuitry and techniques for reading, writing and/or operating semiconductor memory cells of a memory cell array, including, for example, electrically floating body transistors in which an electrical charge is stored in the body of the transistor. In one aspect, the present inventions are directed to one or more independently controllable parameters of a memory operation (e.g., restore, write, refresh), to program or write a data state into a memory cell. In one embodiment, the parameter is the amount of time of programming or writing a predetermined data state into a memory cell. In another embodiment, the controllable parameter is the amplitude of the voltage of the control signals applied to the gate, drain region and/or source region during programming or writing a predetermined data state into a memory cell. Indeed, the controllable parameters may be both temporal and voltage amplitude. Notably, the memory cell array may comprise a portion of an integrated circuit device, for example, logic device (e.g., a microprocessor) or a portion of a memory device (e.g., a discrete memory).

21 Claims, 31 Drawing Sheets

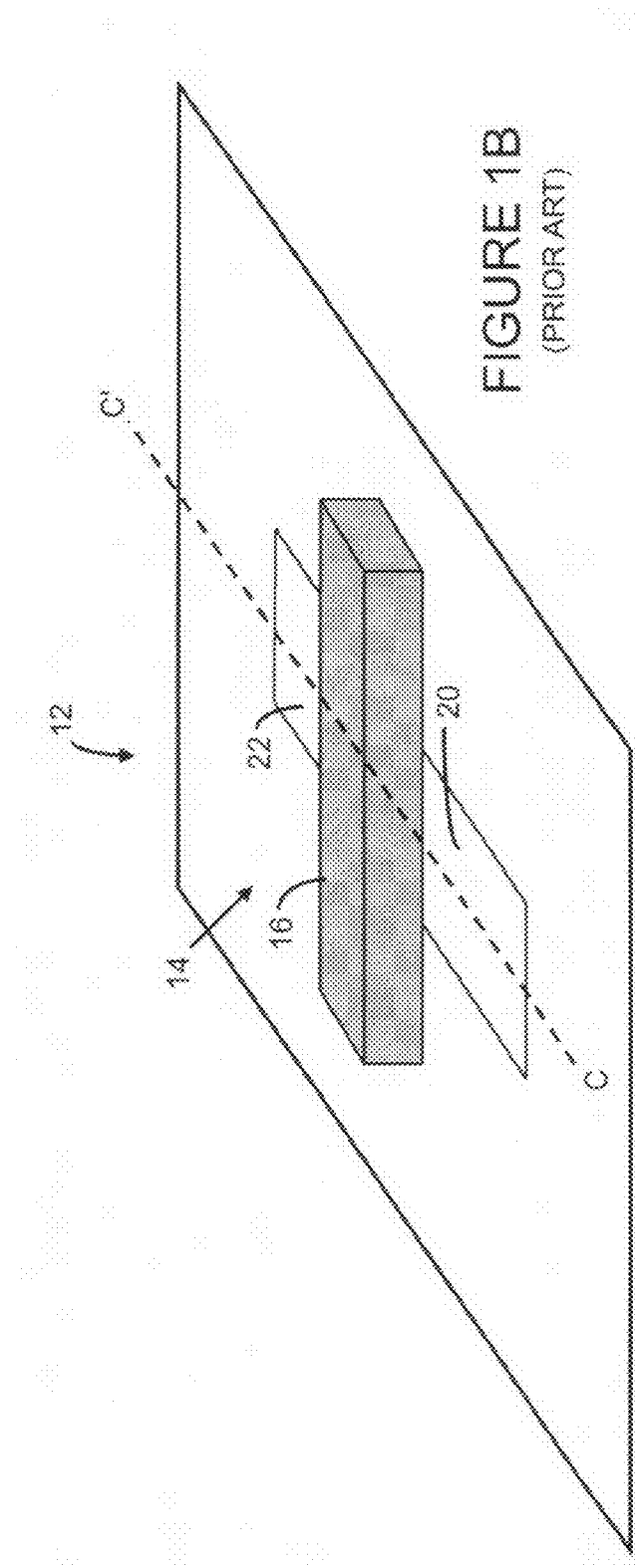
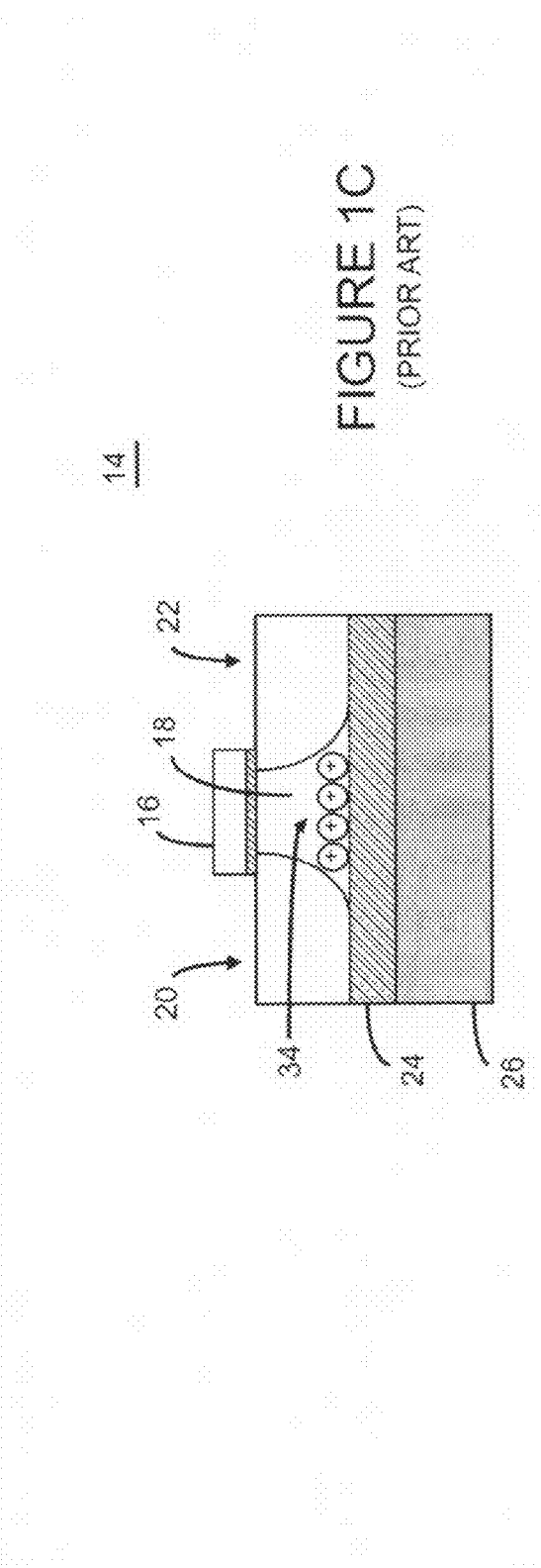

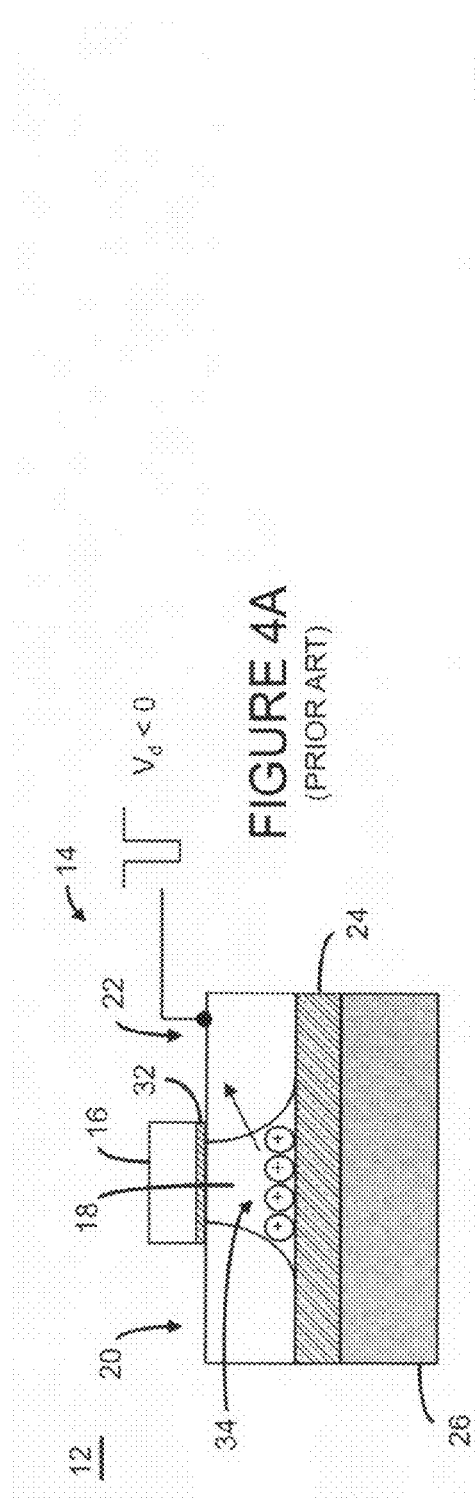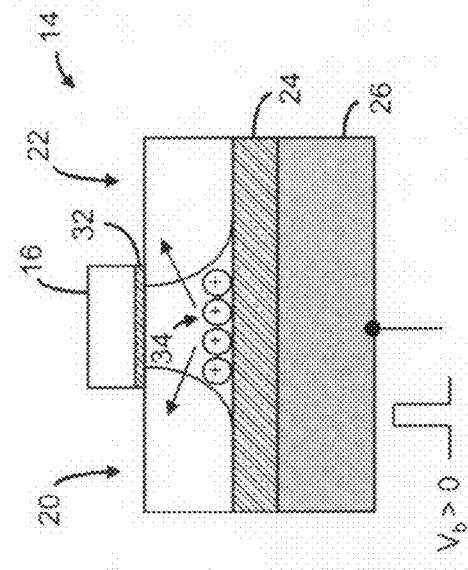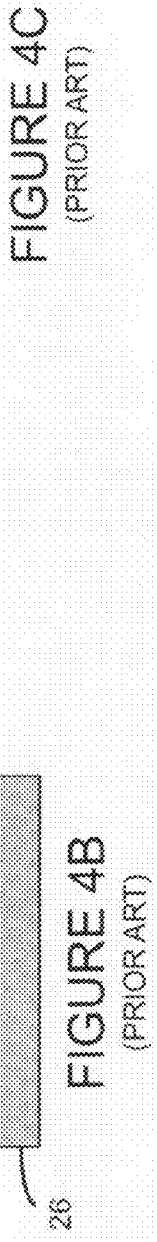
FIGURE 4A (PRIOR ART)
FIGURE 4B (PRIOR ART)
FIGURE 4C (PRIOR ART)

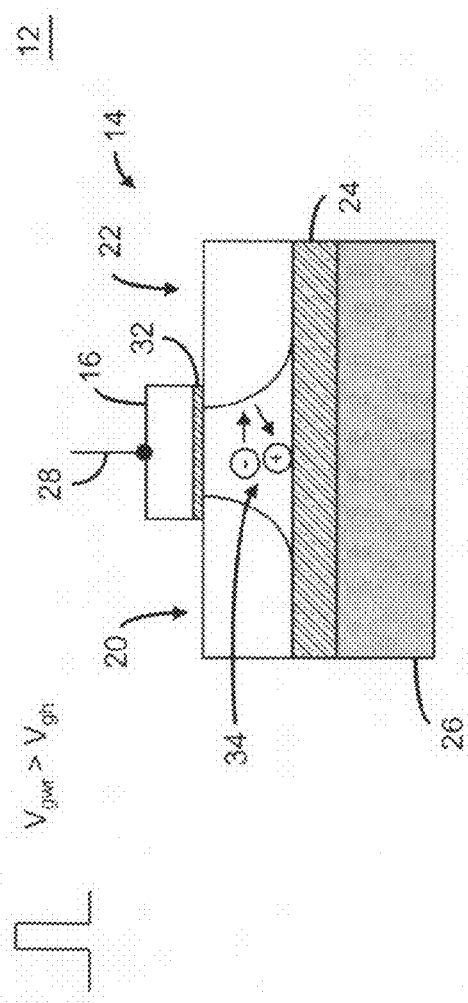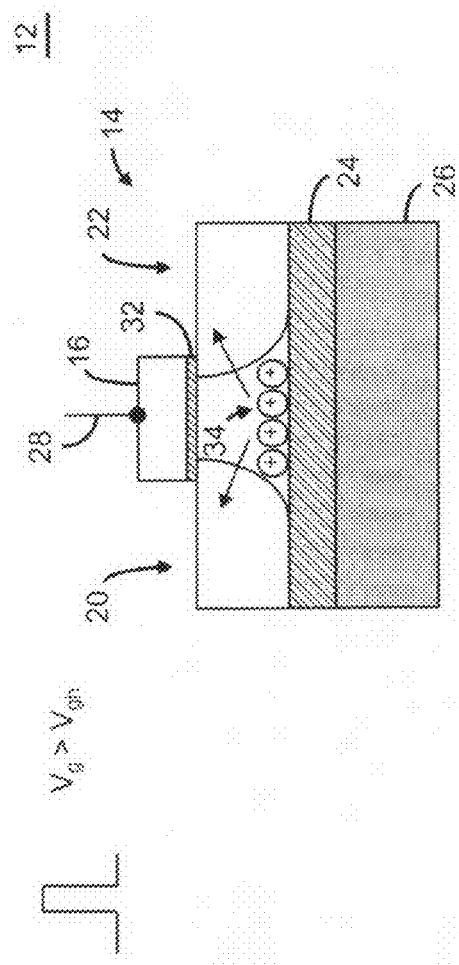

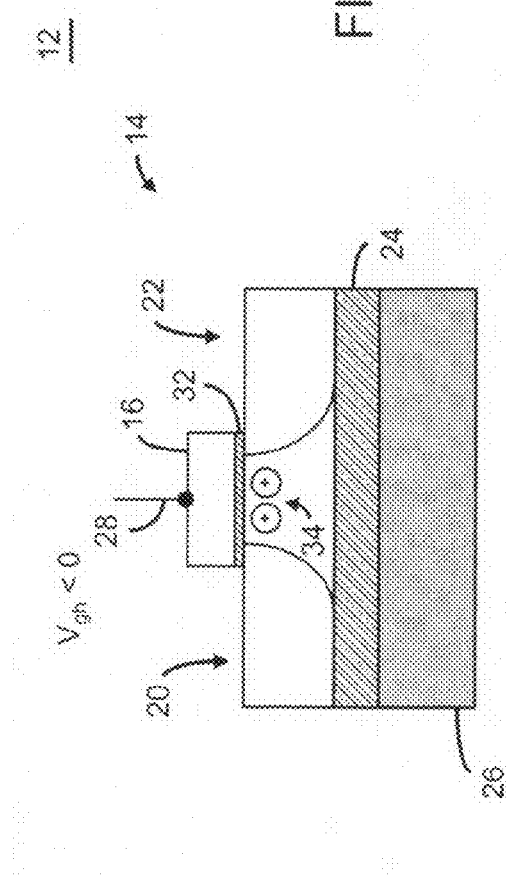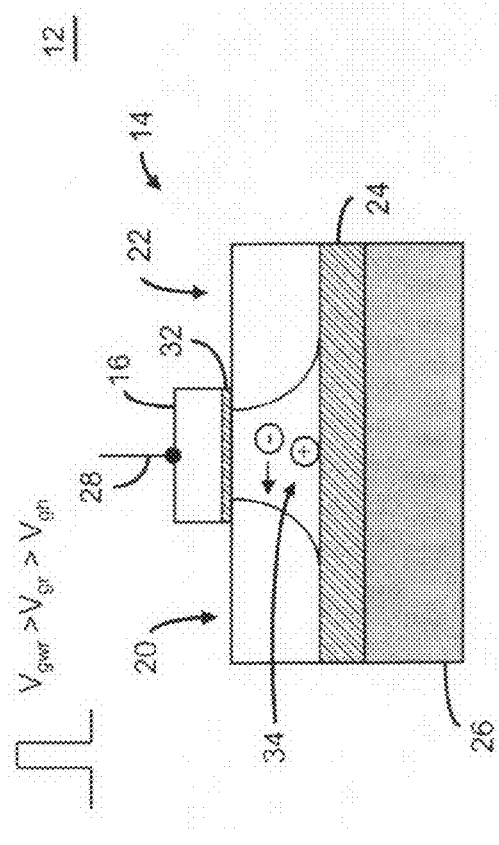

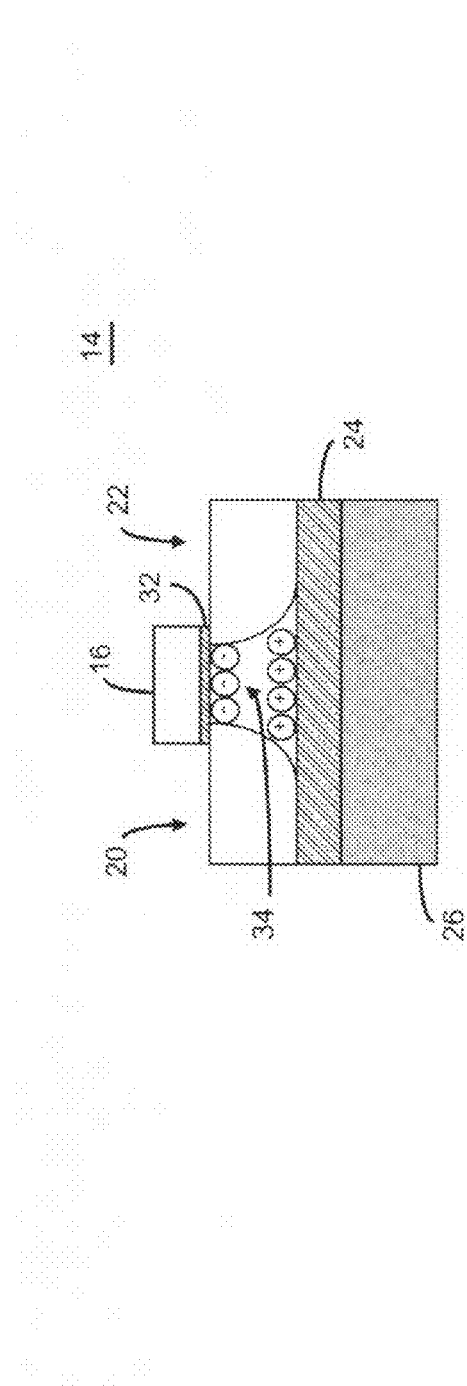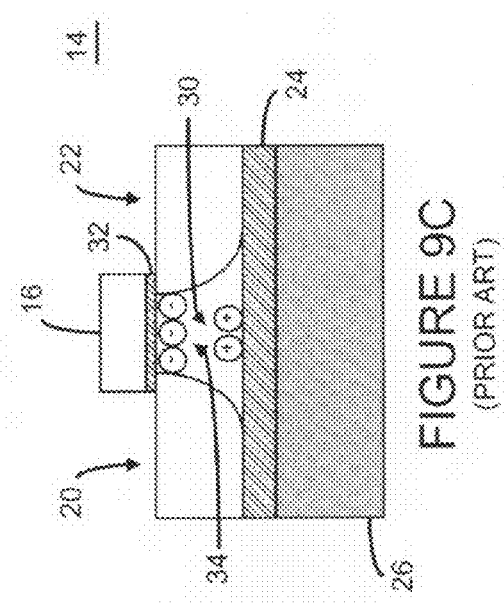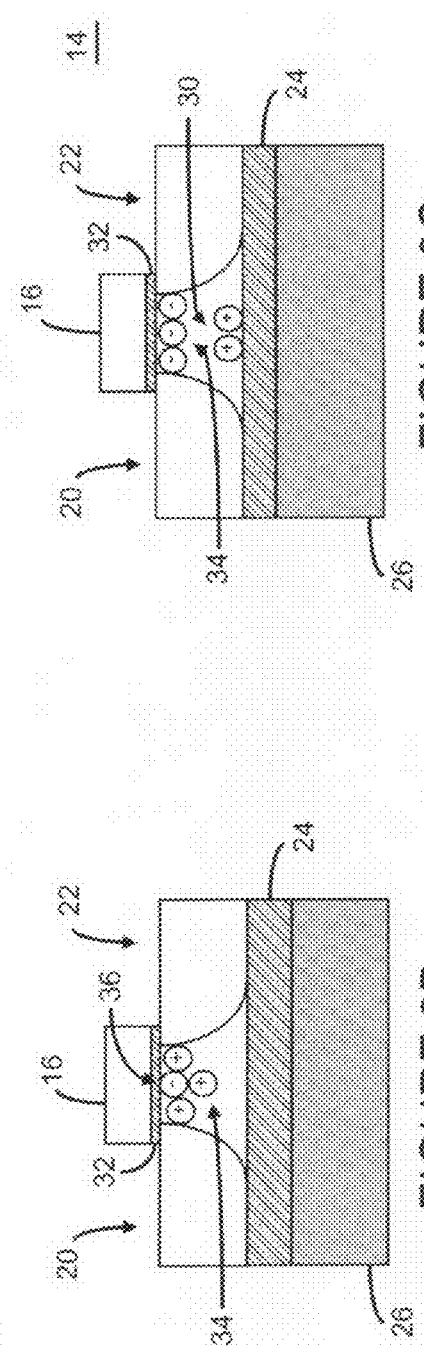
FIGURE 9A (PRIOR ART)
FIGURE 9B (PRIOR ART)
FIGURE 9C (PRIOR ART)

METHOD AND APPARATUS FOR VARYING THE PROGRAMMING DURATION AND/OR VOLTAGE OF AN ELECTRICALLY FLOATING BODY TRANSISTOR, AND MEMORY CELL ARRAY IMPLEMENTING SAME

RELATED APPLICATION

This application is a continuation application of application Ser. No. 11/590,147, filed Oct. 31, 2006, now U.S. Pat. No. 7,436,706. This application and the '147 application claim priority to: (1) U.S. Provisional Application Ser. No. 60/731,668, entitled "Method and Apparatus for Varying the Programming Duration of a Floating Body Transistor, and Memory Cell, Array, and/or Device Implementing Same", filed Oct. 31, 2005, and (2) U.S. Provisional Application Ser. No. 60/736,613, entitled "Method and Apparatus for Varying the Programming Duration of a Floating Body Transistor, and Memory Cell, Array, and/or Device Implementing Same", filed Nov. 15, 2005. The contents of these provisional applications are incorporated by reference herein in their entirety.

BACKGROUND

The inventions relate to a semiconductor memory cell, array, architecture and device, and techniques for controlling and/or operating such cell, array and device; and more particularly, in one aspect, to a dynamic random access memory ("DRAM") cell, array, architecture and device, wherein the memory cell includes an electrically floating body wherein an electrical charge is stored therein.

There is a continuing trend to employ and/or fabricate advanced integrated circuits using techniques, materials and devices that improve performance, reduce leakage current and enhance overall scaling. Semiconductor-on-Insulator (SOI) is a material in which such devices may be fabricated or disposed on or in (hereinafter collectively "on"). Such devices are known as SOI devices and include, for example, partially depleted (PD), fully depleted (FD) devices, multiple gate devices (for example, double or triple gate), and Fin-FET.

One type of dynamic random access memory cell is based on, among other things, the electrically floating body effect of SOI transistors. (See, for example, U.S. Pat. No. 6,969,662, incorporated herein by reference). In this regard, the dynamic random access memory cell may consist of a PD or a FD SOI transistor (or transistor formed in bulk material/substrate) on having a channel, which is disposed adjacent to the body and separated therefrom by a gate dielectric. The body region of the transistor is electrically floating in view of the insulation layer (or non-conductive region, for example, in a bulk-type material/substrate) disposed beneath the body region. The state of memory cell is determined by the concentration of charge within the body region of the SOI transistor.

With reference to FIGS. 1A, 1B and 1C, in one embodiment, semiconductor DRAM array 10 includes a plurality of memory cells 12 each consisting of transistor 14 having gate 16, body region 18, which is electrically floating, source region 20 and drain region 22. The body region 18 is disposed between source region 20 and drain region 22. Moreover, body region 18 is disposed on or above region 24, which may be an insulation region (for example, in an SOI material/substrate) or non-conductive region (for example, in a bulk-type material/substrate). The insulation or non-conductive region 24 may be disposed on substrate 26.

Data is written into or read from a selected memory cell by applying suitable control signals to a selected word line(s) 28, a selected source line(s) 30 and/or a selected bit line(s) 32. In response, charge carriers are accumulated in or emitted and/or ejected from electrically floating body region 18 wherein the data states are defined by the amount of carriers within electrically floating body region 18. Notably, the entire contents of the '662 patent, including, for example, the features, attributes, architectures, configurations, materials, techniques and advantages described and illustrated therein, are incorporated by reference herein.

As mentioned above, memory cell 12 of DRAM array 10 operates by accumulating in or emitting/ejecting majority carriers (electrons or holes) 34 from body region 18 of, for example, N-channel transistors. (See, FIGS. 2A and 2B). In this regard, accumulating majority carriers (in this example, "holes") 34 in body region 18 of memory cells 12 via, for example, impact ionization near source region 20 and/or drain region 22, is representative of a logic high or "1" data state. (See, FIG. 2A). Emitting or ejecting majority carriers 30 from body region 18 via, for example, forward biasing the source/body junction and/or the drain/body junction, is representative of a logic low or "0" data state. (See, FIG. 2B).

Notably, for at least the purposes of this discussion, a logic high or State "1" corresponds to an increased concentration of majority carriers in the body region relative to an unprogrammed device and/or a device that is programmed with a logic low or State "0". In contrast, a logic low or State "0" corresponds to a reduced concentration of majority carriers in the body region relative to an unprogrammed device and/or a device that is programmed with logic high or State "1".

Conventional reading is performed by applying a small drain bias and a gate bias above the transistor threshold voltage. The sensed drain current is determined by the charge stored in the floating body giving a possibility to distinguish between the states "1" and "0". A floating body memory device has two different current states corresponding to the two different logical states: "1" and "0".

In one conventional technique, the memory cell is read by applying a small bias to the drain of the transistor as well as a gate bias which is above the threshold voltage of the transistor. In this regard, in the context of memory cells employing N-type transistors, a positive voltage is applied to one or more word lines 28 to enable the reading of the memory cells associated with such word lines. The amount of drain current is determined/affected by the charge stored in the electrically floating body region of the transistor. As such, conventional reading techniques sense the amount of the channel current provided/generated in response to the application of a predetermined voltage on the gate of the transistor of the memory cell to determine the state of the memory cell; a floating body memory cell may have two or more different current states corresponding to two or more different logical states (for example, two different current conditions/states corresponding to the two different logical states: "1" and "0").

In short, conventional writing programming techniques for memory cells having an N-channel type transistor often provide an excess of majority carriers by channel impact ionization (see, FIG. 3A) or by band-to-band tunneling (gate-induced drain leakage "GIDL") (see, FIG. 3B). The majority carrier may be removed via drain side hole removal (see, FIG. 4A), source side hole removal (see, FIG. 4B), or drain and source hole removal, for example, using the back gate pulsing (see, FIG. 4C).

The memory cell 12 having electrically floating body transistor 14 may be programmed/read using other techniques including techniques that may, for example, provide lower power consumption relative to conventional techniques. For example, memory cell 12 may be programmed, read and/or controlled using the techniques and circuitry described and illustrated in U.S. Non-Provisional patent application Ser. No. 11/509,188, filed on Aug. 24, 2006, and entitled "Memory Cell and Memory Cell Array Having an Electrically Floating Body Transistor, and Methods of Operating Same" (hereinafter "the '188 application"), which is incorporated by reference herein. In one aspect, the '188 application is directed to programming, reading and/or control methods which allow low power memory programming and provide larger memory programming window (both relative to at least the conventional programming techniques).

With reference to FIG. 5, in one embodiment, the '188 application employs, writes or programs a logic "1" or logic high using control signals (having predetermined voltages, for example, Vg=0 v, Vs=0 v, and Vd=3 v) which are applied to gate 16, source region 20 and drain region 22 (respectively) of transistor 14 of memory cell 12. Such control signals induce or cause impact ionization and/or the avalanche multiplication phenomenon (FIG. 5). The predetermined voltages of the control signals, in contrast to the conventional method program or write logic "1" in the transistor of the memory cell via impact ionization and/or avalanche multiplication in the electrically floating body. In one embodiment, it is preferred that the bipolar transistor current responsible for impact ionization and/or avalanche multiplication in the floating body is initiated and/or induced by a control pulse which is applied to gate 16. Such a pulse may induce the channel impact ionization which increases the floating body potential and turns on the bipolar current. An advantage of the described method is that larger amount of the excess majority carriers is generated compared to other techniques.

Further, with reference to FIG. 6, when writing or programming logic "0" in transistor 14 of memory cell 12, in one embodiment of the '188 application, the control signals (having predetermined voltages (for example, Vg=1.5 v, Vs=0 v and Vd=0 v) are different and, in at least one embodiment, higher than a holding voltage (if applicable)) are applied to gate 16, source region 20 and drain region 22 (respectively) of transistor 14 of memory cell 12. Such control signals induce or provide removal of majority carriers from the electrically floating body of transistor 14. In one embodiment, the majority carriers are removed, eliminated or ejected from body region 18 through source region 20 and drain region 22. (See, FIG. 6). In this embodiment, writing or programming memory cell 12 with logic "0" may again consume lower power relative to conventional techniques.

When memory cell 12 is implemented in a memory cell array configuration, it may be advantageous to implement a "holding" operation for certain memory cells 12 when programming one or more other memory cells 12 of the memory cell array to enhance the data retention characteristics of such certain memory cells 12. The transistor 14 of memory cell 12 may be placed in a "holding" state via application of control signals (having predetermined voltages) that are applied to gate 16 and source region 20 and drain region 22 of transistor 14 of memory cell 12. In combination, such control signals provide, cause and/or induce majority carrier accumulation in an area that is close to the interface between gate dielectric 32 and electrically floating body region 18. (See, FIG. 7). In this embodiment, it may be preferable to apply a negative voltage to gate 16 where transistor 14 is an N-channel type transistor.

With reference to FIG. 8, in one embodiment of the '188 application, the data state of memory cell 12 may be read and/or determined by applying control signals (having predetermined voltages, for example, Vg=−0.5 v, Vs=3 v and Vd=0 v) to gate 16 and source region 20 and drain region 22 of transistor 14. Such signals, in combination, induce and/or cause the bipolar transistor current in those memory cells 12 storing a logic state "1". For those memory cells that are programmed to a logic state "0", such control signals do not induce and/or cause a considerable, substantial or sufficiently measurable bipolar transistor current in the cells programmed to "0" state. (See, the '188 application, which, as noted above, is incorporated by reference).

As mentioned above, the reading may be performed using positive voltages applied to word lines 28. As such, transistors 14 of device 10 are periodically pulsed between a positive gate bias, which (1) drives majority carriers (holes for N-channel transistors) away from the interface between gate insulator 32 and body region 18 of transistor 14 and (2) causes minority carriers (electrons for N-channel transistors) to flow from source region 20 and drain region 22 into a channel formed below gate 16, and the negative gate bias, which causes majority carriers (holes for N-channel transistors) to accumulate in or near the interface between gate 16 and body region 18 of transistor 14.

With reference to FIG. 9A, a positive voltage applied to gate 16 provides a positive gate bias which causes (1) a channel of minority carriers 34 to form beneath gate 16 and (2) accumulation of majority carriers 30 in body region 18 in an area "opposite" the interface of gate 16 and body region 18. Here, minority carriers (i.e., electrons in an N-channel transistor) may flow in the channel beneath the interface of gate oxide 32 and floating body region 18 wherein some of the minority carriers 34 are "trapped" by or in defects within the semiconductor (typically created or caused by the transition from one material type to another).

With reference to FIG. 9B, when a negative voltage is applied to gate 16, the gate bias is negative which substantially eliminates the channel of minority carriers 34 beneath gate 16 (and gate oxide 32). However, some of minority carriers may remain "trapped" in the interface defects (illustrated generally by electrons 36).

Some of the trapped electrons 36 recombine with majority carriers which are attracted to gate 16 (due to the negative gate bias), and, as such, the net charge of majority carriers 30 located in floating body region 18 may decrease over time (see, for example, FIG. 9C relative to FIG. 9A). This phenomenon may be characterized as charge pumping. Thus, pulsing between positive and negative gate biases (during read and write operations) may reduce the net quantity of charge in memory cell 12, which, in turn, may gradually eliminate the data stored in memory cell 12.

One technique that may address this problem is to perform a write operation to restore the net charge of majority carriers 30 after each read operation. Notably, an additional source of charge degradation is leakage and recombination over time. This second effect requires periodic refresh.

With reference to FIGS. 10 and 11, when the data state of memory cell 12 is read or sensed using conventional techniques, a write operation must be performed to restore the data state "1". In addition, a write operation must be performed periodically to refresh the data state. Conventionally, these operations are implemented using circuitry that provides an identical and fixed duration for each operation. As such, these write operations would be indistinguishable from each other and the duration of each memory operation being identical regardless of operation (for example, restore and refresh).

SUMMARY OF THE INVENTIONS

There are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, many of those permutations and combinations will not be discussed separately herein.

In a first principle aspect, the present inventions are directed to an integrated circuit device comprising a memory cell array having a plurality of memory cells wherein each memory cell includes an electrically floating body transistor (for example, disposed on/in a bulk-type semiconductor substrate or on/in a SOI-type substrate) including a source region, a drain region, an electrically floating body region disposed between the source and drain regions, and a gate disposed over the body region. Each memory cell includes: (i) a first data state which is representative of a first charge in the body region of the electrically floating body transistor, and (ii) a second data state which is representative of a second charge in the body region of the electrically floating body transistor.

The integrated circuit device of this aspect includes circuitry, coupled to the memory cell array, to program one or more of the memory cells. The circuitry to program one or more of the memory cells includes control signal generation circuitry, coupled to the memory cells, to generate control signals, having temporal characteristics, of a first predetermined program operation and a second predetermined program operation. The circuitry also includes programmable duration circuitry (for example, one or more programmable counters, registers and/or RC circuits), coupled to the control signal generation circuitry, to control the temporal characteristics of one or more control signals of the first predetermined program operation and the second predetermined program operation, wherein the temporal characteristics of the one or more control signals (for example, signals applied to the gate, source region and/or drain region of an electrically floating body transistor) of the first predetermined program operation are different from the temporal characteristics of corresponding control signals of the second predetermined program operation.

The programmable duration circuitry may include a plurality of circuits including: (i) a first circuit to control the temporal characteristics of one or more control signals of a write operation, and (ii) a second circuit to control the temporal characteristics of one or more control signals of a refresh operation. In another embodiment, the programmable duration circuitry may include: (i) a first circuit to control the temporal characteristics of one or more control signals of a write operation, and (ii) a second circuit to control the temporal characteristics of one or more control signals of a restore operation. The programmable duration circuitry may also include: (i) a first circuit to control the temporal characteristics of one or more control signals of a write operation, (ii) a second circuit to control the temporal characteristics of one or more control signals of a refresh operation, and (iii) a third circuit to control the temporal characteristics of one or more control signals of a restore operation.

In one embodiment, the programmable duration circuitry includes: (i) a first register to store a first value which is representative of a temporal characteristic of one or more control signals of a write operation, and (ii) a second register to store a second value which is representative of a temporal characteristic of one or more control signals of a refresh operation. The programmable duration circuitry of this embodiment may further include: (i) a multiplexer, coupled to the first and second registers, to responsively output one of the first or second values, and (ii) a programmable timer, coupled to the multiplexer, to generate a signal which is representative of the temporal characteristics of one or more control signals of the write operation or the refresh operation using the first value or second value, respectively.

In another embodiment, the programmable duration circuitry includes: (i) a first register to store a first value which is representative of a temporal characteristic of one or more control signals of a write operation, (ii) a second register to store a second value which is representative of a temporal characteristic of one or more control signals of a refresh operation, and (iii) a third register to store a third value which is representative of a temporal characteristic of one or more control signals of a restore operation. The programmable duration circuitry of this embodiment may also include: (i) a multiplexer, coupled to the first, second and third registers, to responsively output one of the first, second or third values, and (ii) a programmable timer, coupled to the multiplexer, to generate a signal which is representative of the temporal characteristics of one or more control signals of the write operation, the refresh operation or the restore operation using the first value, second value or third value, respectively.

The circuitry to program one or more of the memory cells for a plurality of predetermined memory operations, may further include programmable voltage circuitry, coupled to the control signal generation circuitry, to control the amplitude characteristics of the voltage of one or more control signals of the first predetermined program operation and the second predetermined program operation. The voltage amplitude characteristics of the one or more control signals (for example, signals applied to the gate, source region and/or drain region of an electrically floating body transistor) of the first predetermined program operation are different from the voltage amplitude characteristics of corresponding control signals of the second predetermined program operation. The programmable voltage circuitry may include a plurality of circuits including a first circuit to control the voltage amplitude characteristics of one or more control signals of a write operation, and a second circuit to control the voltage amplitude characteristics of one or more control signals of a refresh operation. The programmable voltage circuitry may include a plurality of circuits including a first circuit to control the voltage amplitude characteristics of one or more control signals of a write operation, and a second circuit to control the voltage amplitude characteristics of one or more control signals of a restore operation.

Indeed, the programmable voltage circuitry may include a plurality of circuits including: (i) a first circuit to control the voltage amplitude characteristics of one or more control signals of a write operation, (ii) a second circuit to control the voltage amplitude characteristics of one or more control signals of a refresh operation, and (iii) a third circuit to control the voltage amplitude characteristics of one or more control signals of a restore operation.

In another principle aspect, the present inventions are directed to an integrated circuit device an integrated circuit device comprising a memory cell array having a plurality of memory cells wherein each memory cell includes an electrically floating body transistor (for example, disposed on/in a bulk-type semiconductor substrate or on/in a SOI-type substrate) including a source region, a drain region, an electrically floating body region disposed between the source and drain regions, and a gate disposed over the body region. Each memory cell includes: (i) a first data state which is representative of a first charge in the body region of the electrically floating body transistor, and (ii) a second data state which is representative of a second charge in the body region of the electrically floating body transistor.

The integrated circuit device of this aspect includes circuitry, coupled to the memory cell array, to program one or more of the memory cells, wherein the circuitry includes control signal generation circuitry, coupled to the memory cells, to generate control signals, having voltage amplitude characteristics, of a first predetermined program operation and a second predetermined program operation. The circuitry also includes programmable voltage circuitry, coupled to the control signal generation circuitry, to control the amplitude characteristics of the voltage of one or more control signals (for example, signals applied to the gate, source region and/or drain region of an electrically floating body transistor) of the first predetermined program operation and the second predetermined program operation. The voltage amplitude characteristics of the one or more control signals of the first predetermined program operation are different from at least one of the voltage amplitude characteristics of corresponding control signals of the second predetermined program operation.

In one embodiment, the programmable voltage circuitry includes a plurality of circuits including a first circuit to control the voltage amplitude characteristics of one or more control signals of a write operation, and a second circuit to control the voltage amplitude characteristics of one or more control signals of a refresh operation. In another embodiment, the programmable voltage circuitry includes a plurality of circuits including a first circuit to control the voltage amplitude characteristics of one or more control signals of a write operation, and a second circuit to control the voltage amplitude characteristics of one or more control signals of a restore operation. In yet another embodiment, the programmable voltage circuitry includes a plurality of circuits including: (i) a first circuit to control the voltage amplitude characteristics of one or more control signals of a write operation, (ii) a second circuit to control the voltage amplitude characteristics of one or more control signals of a refresh operation, and (iii) a third circuit to control the voltage amplitude characteristics of one or more control signals of a restore operation.

The programmable voltage circuitry may include: (i) a first register to store a first value which is representative of a voltage amplitude characteristic of one or more control signals (for example, control signals applied to the gate, source region and/or drain region of an electrically floating body transistor) of a write operation, and (ii) a second register to store a second value which is representative of a voltage amplitude characteristic of one or more control signals of a refresh operation. The programmable duration circuitry may include: (i) a first register to store a first value which is representative of a voltage amplitude characteristic of one or more control signals of a write operation, (ii) a second register to store a second value which is representative of a voltage amplitude characteristic of one or more control signals of a refresh operation, and (iii) a third register to store a third value which is representative of a voltage amplitude characteristic of one or more control signals of a restore operation.

Again, there are many inventions, and aspects of the inventions, described and illustrated herein. This Summary of the Inventions is not exhaustive of the scope of the present inventions. Moreover, this Summary of the Inventions is not intended to be limiting of the inventions and should not be interpreted in that manner. While certain embodiments have been described and/or outlined in this Summary of the Inventions, it should be understood that the present inventions are not limited to such embodiments, description and/or outline, nor are the claims limited in such a manner. Indeed, many other embodiments, which may be different from and/or similar to, the embodiments presented in this Summary, will be apparent from the description, illustrations and claims, which follow. In addition, although various features, attributes and advantages have been described in this Summary of the Inventions and/or are apparent in light thereof, it should be understood that such features, attributes and advantages are not required whether in one, some or all of the embodiments of the present inventions and, indeed, need not be present in any of the embodiments of the present inventions.

BRIEF DESCRIPTION OF THE DRAWINGS

In the course of the detailed description to follow, reference will be made to the attached drawings. These drawings show different aspects of the present inventions and, where appropriate, reference numerals illustrating like structures, components, materials and/or elements in different figures are labeled similarly. It is understood that various combinations of the structures, components, materials and/or elements, other than those specifically shown, are contemplated and are within the scope of the present inventions.

Moreover, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, many of those permutations and combinations will not be discussed separately herein.

FIG. 1B is a three dimensional view of an exemplary prior art memory cell comprised of one electrically floating body transistor (PD-SOI NMOS);

FIG. 1C is a cross-sectional view of the prior art memory cell of FIG. 1B, cross-sectioned along line C-C';

FIGS. 4A-4C are exemplary schematics and general illustrations of conventional methods to program a memory cell to logic state "0" (i.e., provide relatively fewer majority carrier by removing majority carriers from the electrically floating body of the transistor of the memory cell of FIG. 1B; majority carriers may be removed through the drain region/terminal of the transistor (FIG. 4A), the source region/terminal of the transistor (FIG. 4B), and through both drain and source regions/terminals of the transistor via using the back gate pulses applied to the substrate/backside terminal of the transistor of the memory cell (FIG. 4C);

FIG. 5 illustrates an exemplary schematic (and control signal voltage relationship) of an exemplary embodiment of an aspect of the '188 application of programming a memory cell to logic state "1" by generating, storing and/or providing an excess of majority carriers in the electrically floating body of the transistor of the memory cell;

FIG. 6 illustrates an exemplary schematic (and control signals) of an exemplary embodiment of an aspect of the '188 application of programming a memory cell to a logic state "0" by generating, storing and/or providing relatively fewer majority carriers (as compared to the number of majority carriers in the electrically floating body of the memory cell that is programmed to a logic state "1") in the electrically floating body of the transistor of the memory cell, wherein the majority carriers are removed (write "0") through both drain and source terminals by applying a control signal (for example, a programming pulse) to the gate of the transistor of the memory cell;

FIG. 7 illustrates an exemplary schematic (and control signals) of an exemplary embodiment of an aspect of the '188 application of holding or maintaining the data state of a memory cell;

FIG. 8 illustrates an exemplary schematic (and control signals) of an exemplary embodiment of an aspect of the '188 application of reading the data state of a memory cell by sensing the amount of the current provided/generated in response to an application of a predetermined voltage on the gate of the transistor of the memory cell;

FIGS. 9A-9C are exemplary schematic and general illustrations of the charge relationship and charge pumping phenomenon caused by pulsing between positive and negative gate biases (during read and write operations) of the memory cell of FIG. 1B;

DETAILED DESCRIPTION

At the outset, it should be noted that there are many inventions described herein as well as many aspects and embodiments of those inventions. The present inventions are directed to circuitry and techniques for reading, writing and/or operating a semiconductor memory cell, array, architecture and device including electrically floating body transistors in which an electrical charge is stored in the body of the transistor. The present inventions are also directed to semiconductor memory cell, array, architecture and device that implement such circuitry and techniques. Notably, the memory cell and/or memory cell array may comprise a portion of an integrated circuit device, for example, logic device (such as, for example, a microcontroller or microprocessor) or a portion of a memory device (such as, for example, a discrete memory).

In particular, in one aspect, the present inventions are directed to independently controllable parameters, for a given memory operation (for example, restore, write, refresh), to program or write a predetermined data state into a memory cell (for example, programming or writing data state "1" in a memory cell). The parameters may be temporal based or voltage based. In one embodiment, the parameter is the amount of time of programming or writing a predetermined data state into a memory cell (for example, data state "1"). In another embodiment, the controllable parameter is the amplitude of the voltage of the control signals applied to the gate, drain region and/or source region during programming or writing a predetermined data state into a memory cell (for example, data state "1"). Indeed, the controllable parameters may be both temporal (the amount of time of programming or writing a predetermined data state into a memory cell for a given memory operation such as restore, write, refresh) and voltage amplitude (the amplitude of the voltage of one or more control signals). In this way, the integrated circuit may observe an improved power and speed performance because of the ability to tailor, control and/or program, for example, the duration of voltages employed in implementing certain memory operations (for example, restore, write, and refresh operations).

Figure 1A:
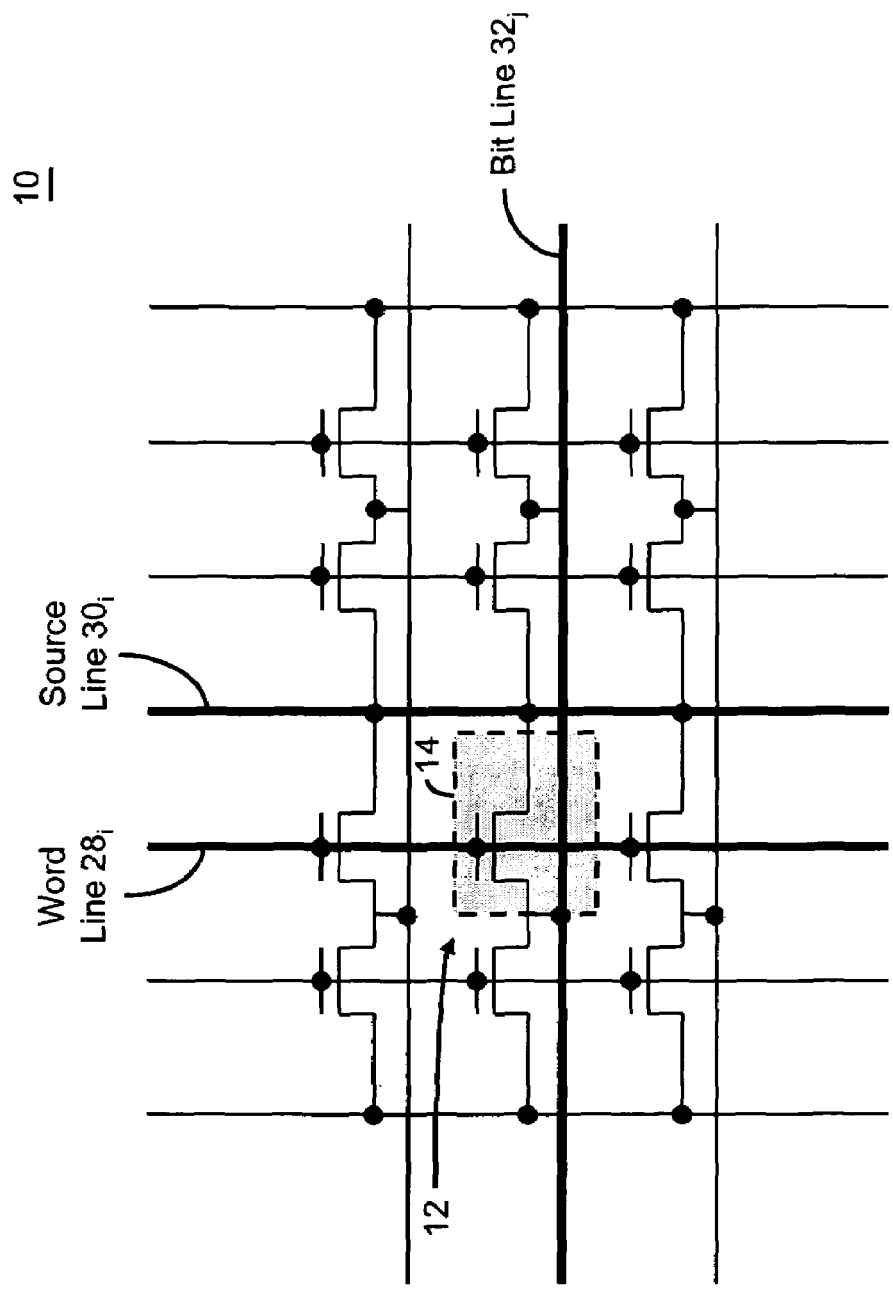
FIG. 1A is a schematic representation of a prior art DRAM array including a plurality of memory cells comprised of one electrically floating body transistor.
Figure 2A:
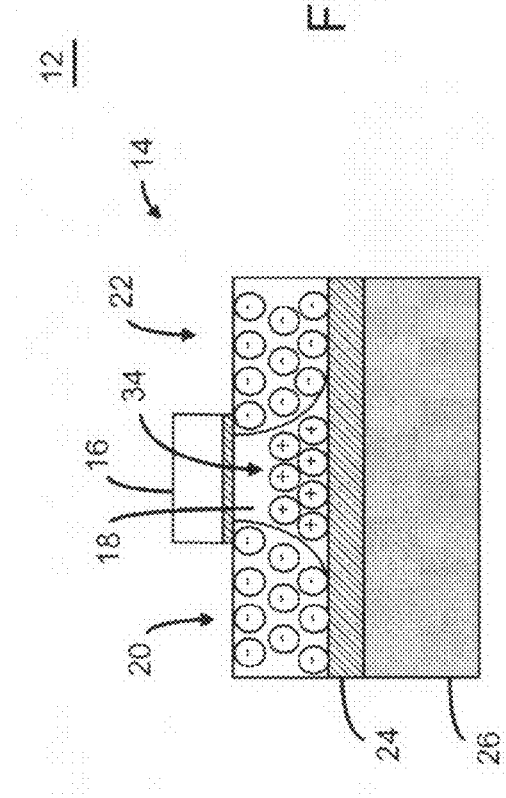
FIGS. 2A and 2B are exemplary schematic illustrations of the charge relationship, for a given data state, of the floating body, source and drain regions of a prior art memory cell comprised of one electrically floating body transistor (PD-SOI NMOS)
Figure 2B:
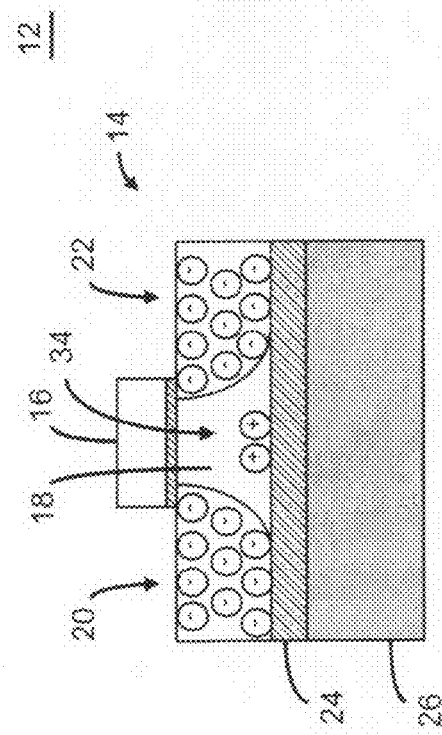
Figure 3A:
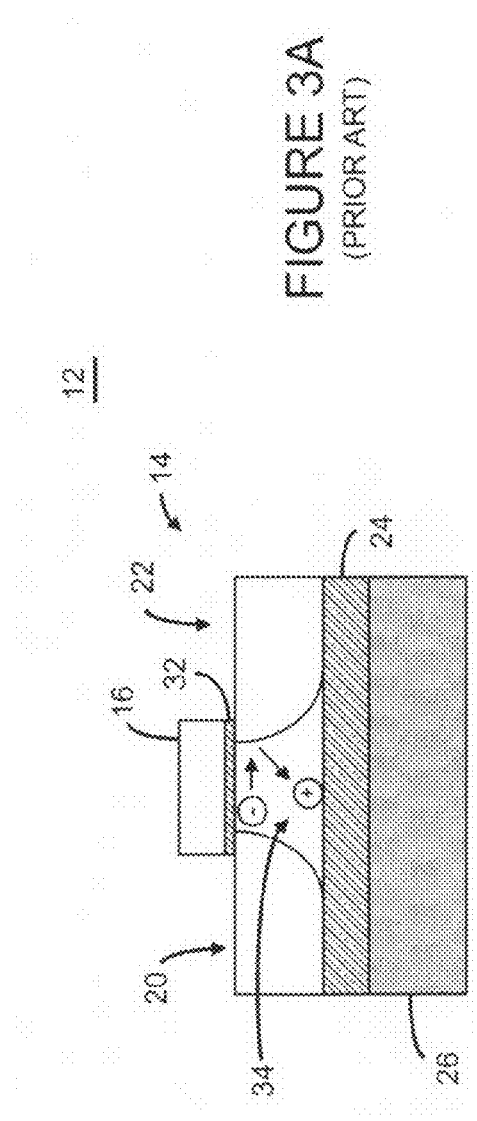
FIGS. 3A and 3B are exemplary schematic and general illustrations of conventional methods to program a memory cell to logic state "1" (i.e., generate or provide an excess of majority carrier in the electrically floating body of the transistor (an N-type channel transistor in this exemplary embodiment) of the memory cell of FIG. 1B; majority carriers in these exemplary embodiments are generated or provided by the channel electron impact ionization (FIG. 3A) and by GIDL or band to band tunneling (FIG. 3B)
Figure 3B:
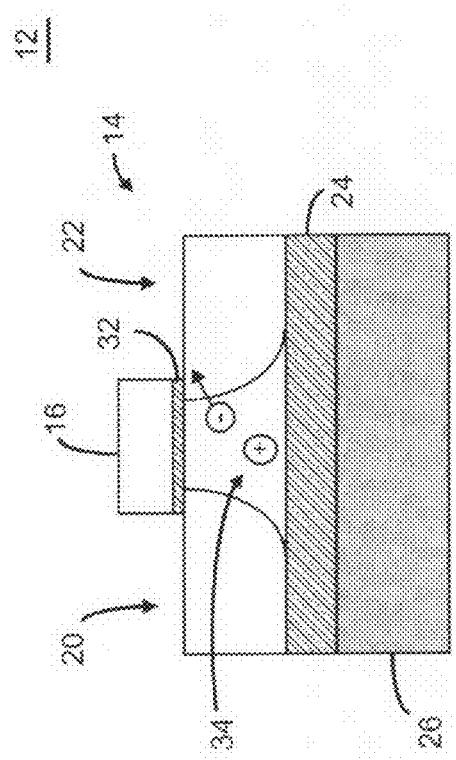
Figure 10:
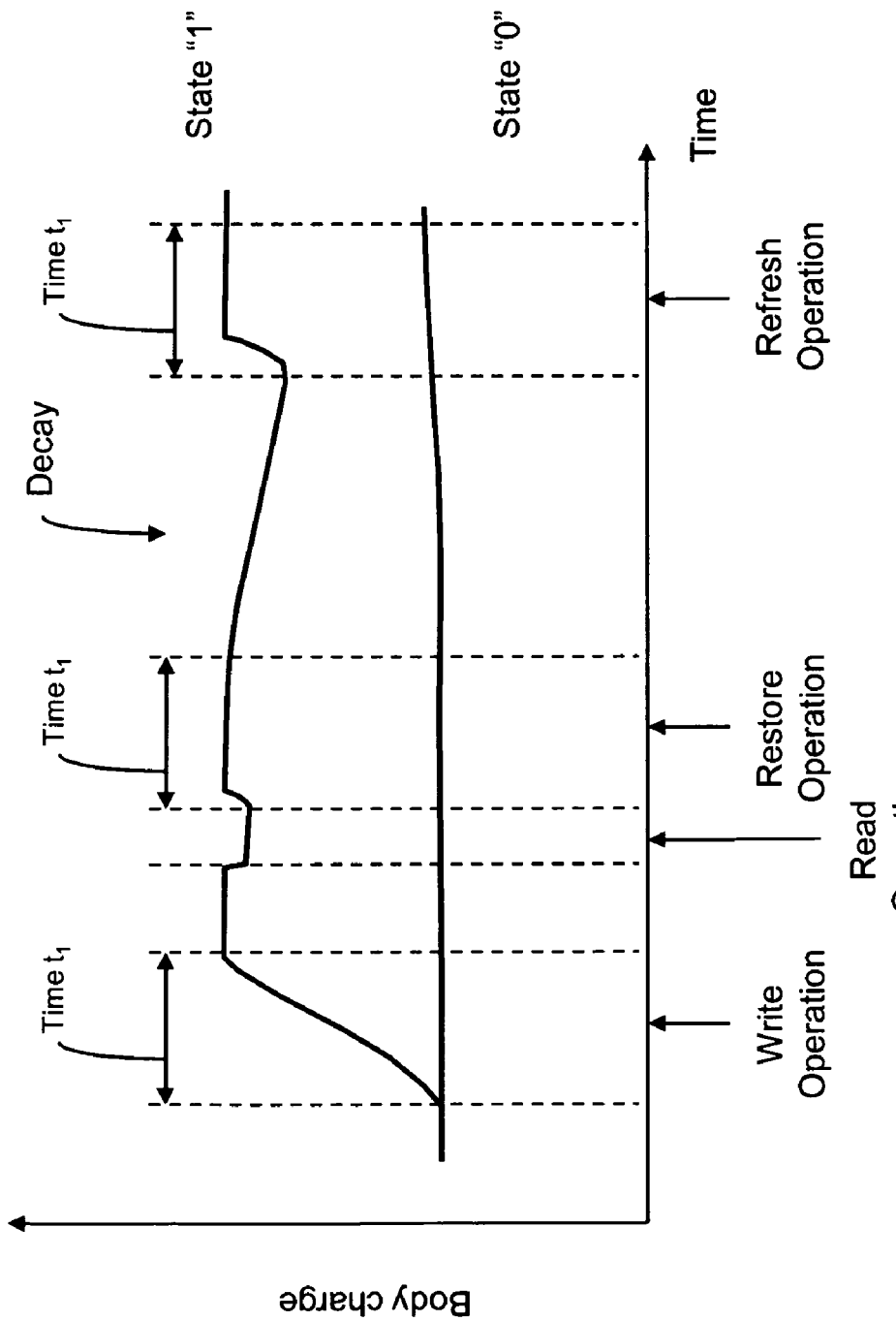
FIG. 10 illustrates changes in the charge in the electrically floating body region over time as a result of conventional reading and writing (programming) operations.
Figure 11:
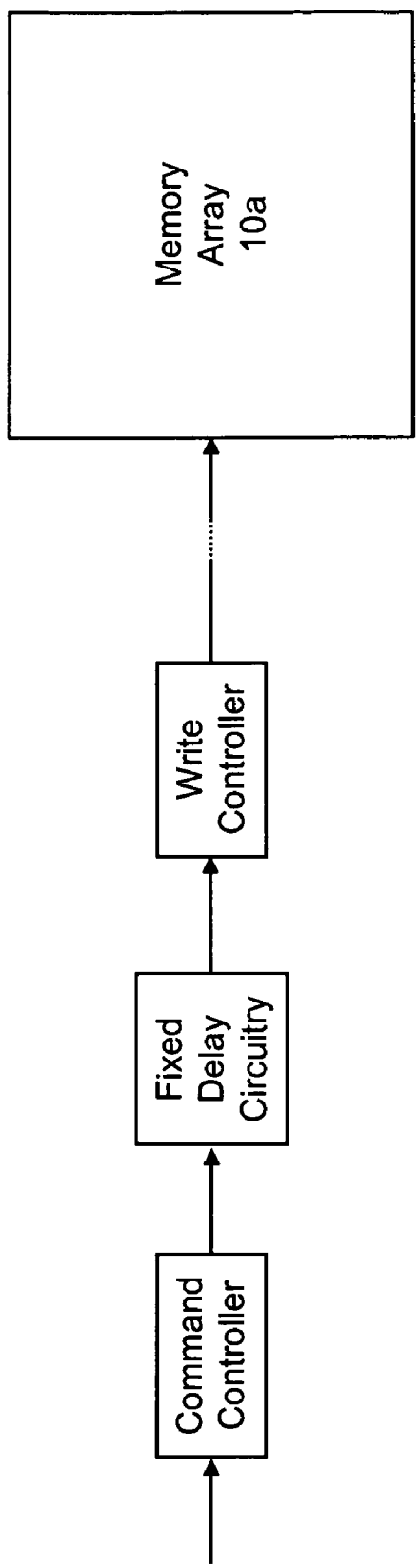
FIG. 11 is a schematic representation illustrating conventional fixed delay element circuitry, in conjunction with a command controller and a write controller, which is employed to implement conventional writing, restore and refresh operations.
Figure 12:
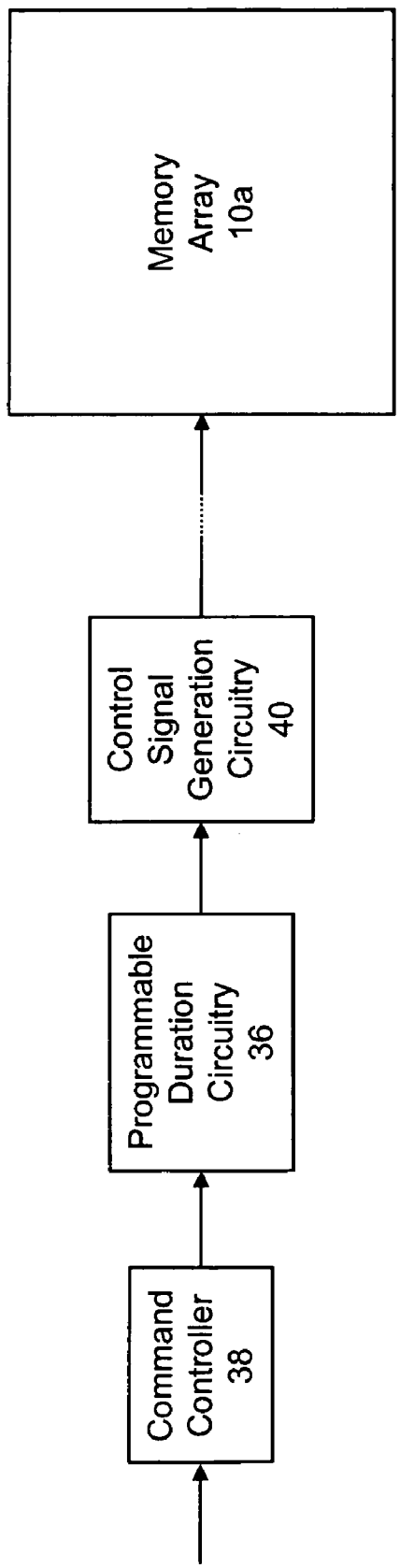
FIG. 12 is a schematic representation illustrating programmable duration circuitry, in conjunction with a command controller and control signal generation circuitry (for example, a write controller), which is employed to implement a programmable/controllable duration of a write operation (for example, operations to write data state "1", restore and/or refresh operations), according to one aspect of the present inventions.

With reference to FIG. 12, in one embodiment, the present inventions include programmable duration circuitry 36 that provides one or more signals to control the duration of a memory operation (for example, write, refresh or restore) which programs one or more memory cells of a memory array to a predetermined memory state. The controllable duration circuitry 36 receives one or more signals from command controller 38 (for example, a state machine, microprocessor, microcontroller, discrete logic, and/or programmable gate array) that is/are representative of a memory operation (for example, write, refresh or restore). The output of programmable duration circuitry 36 is provided to control signal generation circuitry 40 (for example, a write controller) which, in response, generates suitable control signals, for a duration of time which is representative of the output of programmable duration circuitry 36, to implement the predetermined programming operation (for example, write, refresh or restore). Thus, in this embodiment, programmable duration circuitry 36 determines or controls the amount of time of programming or writing a predetermined data state into a memory cell (for example, data state "1") via performance of a predetermined memory operations (for example, read, write, refresh).

Figure 13A:
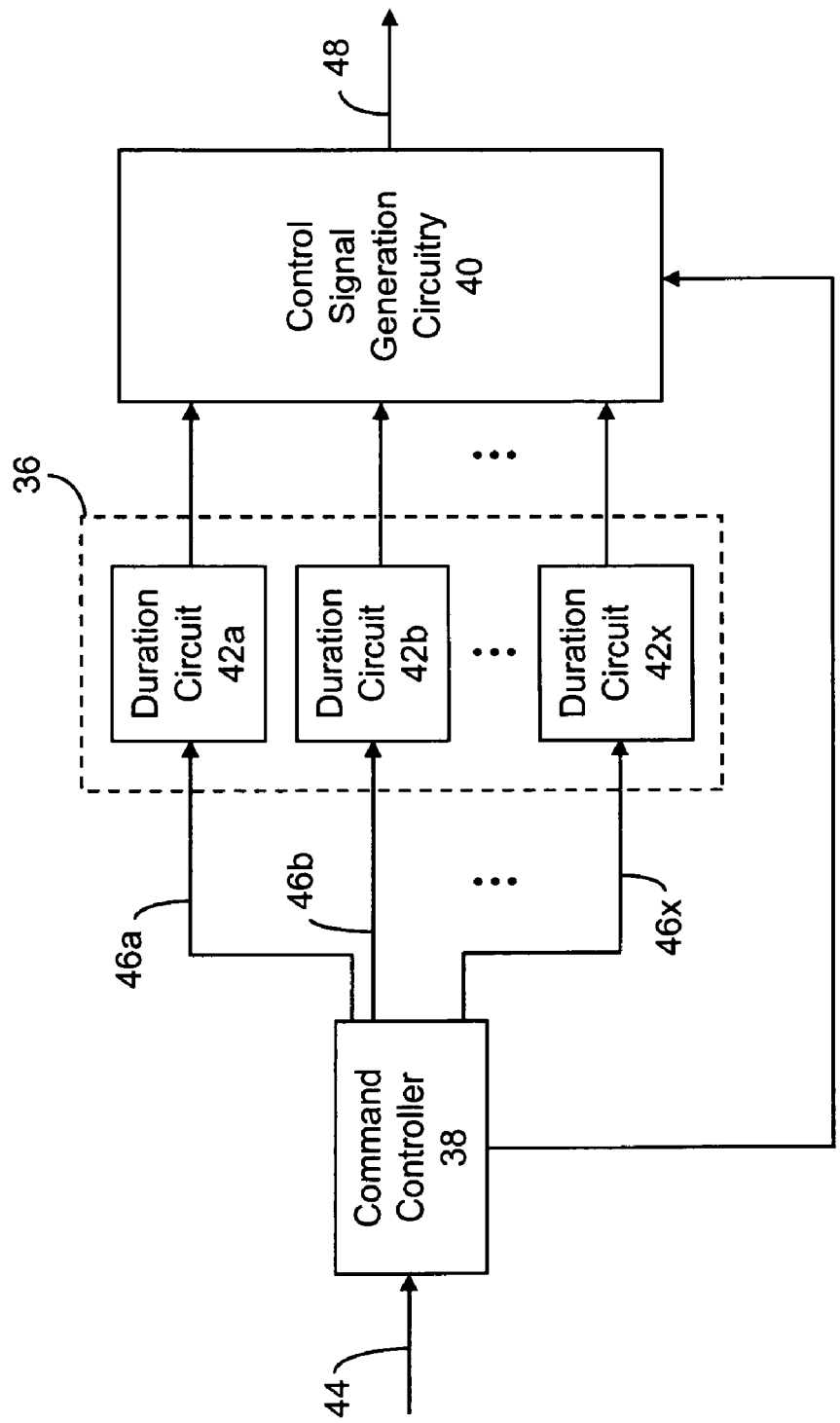
FIGS. 13A and 13B are schematic representations illustrating one embodiment of the programmable duration circuitry of FIG. 12, in conjunction with a command controller and control signal generation circuitry, wherein the programmable duration circuitry includes a plurality of duration circuits to provide a programmable/controllable duration of a plurality of different write or read operations (for example, operations to write data state "1", restore and/or refresh memory operations), according to one aspect of the present inventions.

With reference to FIG. 13A, in one embodiment, programmable duration circuitry 36 includes a plurality of programmable duration circuits 42a-x that are independently controllable to provide a desired duration of a predetermined memory operation (for example, restore, write and refresh).

In one embodiment, each duration circuit 42a-x is coupled to control signal generation circuitry 40 to provide a programming duration for a corresponding memory operation (for example, restore, write logic state "1" and refresh). The duration circuits 42a-x may be an analog or digital circuits (or combination thereof), for example, programmable RC delay circuits, one or more digital counters (wherein control data is stored in associated registers which, as mentioned below, is representative of the temporal characteristics of the associated control signal), and/or any circuit or circuitry, technique whether now known or later developed to provide an adjusted, programmable or controllable duration of a memory operation is intended to fall within the scope of the present inventions.

With continued reference to FIG. 13A, in operation, in one embodiment, one or more independently controllable/programmable duration circuits 42a-x independently control the duration of the programming of data state "1" for write, restore and refresh memory operations or cycles, respectively. The memory operations or cycles are determined by command controller 38, as specified by command inputs 44. The command controller 38 decodes the command inputs (provided on signal lines 44) and, in response, determines the specified memory operation or cycle via memory operation command signal 46a-x. One or more of the active programmable duration circuits 42a-x, which is determined by memory operation or program command signals 46a-x, provide a signal to control signal generation circuitry 40 that is representative of the duration of programming of data state "1" for corresponding memory operation or cycle (for example, write, restore and refresh program operations). As noted above, control signal generation circuitry 40 (for example, a write controller), in response, to the output of the active programmable duration circuits 42a-x, generates suitable control signals, having temporal characteristics which are representative thereof, to implement the predetermined programming operation (for example, write, refresh or restore).

Figure 13B:
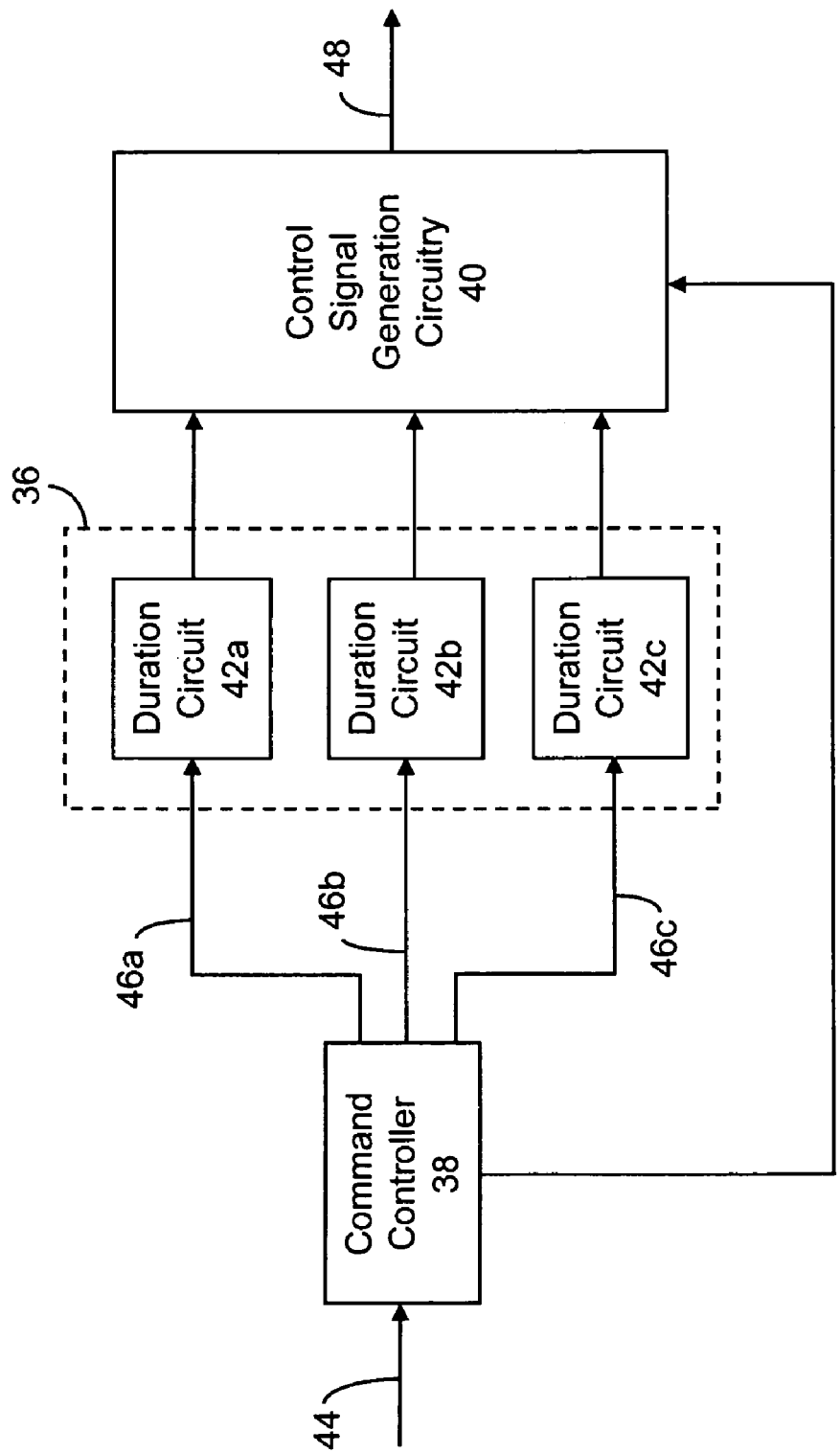

With reference to FIG. 13B, in one embodiment, programmable duration circuitry 36 includes three programmable duration circuits 42a-c. In this embodiment, programmable duration circuit 42a provides one or more signals which correspond to a duration of time for programming a logic state "1" during a write operation. The programmable duration circuit 42b provides one or more signals which correspond to a duration of time for performing a restore memory operation. Further, programmable duration circuit 42c provides one or more signals which correspond to a duration of time for performing a refresh memory operation.

As such, when command controller 38 determines the specified memory operation or cycle (as defined by the command inputs provided on signal lines 44) is a write logic state "1", memory operation command signal 46a enables duration circuit 42a which provides data to control signal generation circuitry 40 which is representative of the duration of performing a write logic state "1" memory operation. Similarly, when command controller 38 determines the specified memory operation or cycle is a restore memory operation, memory operation command signal 46b enables duration circuit 42b which provides data to control signal generation circuitry 40 which is representative of the duration of performing a restore memory operation. Further, when command controller 38 decodes the signals on signal lines 44 and determines that a refresh memory operation is instructed, memory operation command signal 46c enables duration circuit 42c which provides data to control signal generation circuitry 40 which is representative of the duration of performing a refresh memory operation.

The control signal generation circuitry 40, in response to signals from programmable duration circuitry 36, generates suitable control signals (for example, write/program control signals) 48 for a duration that is based on the output of the active duration circuit(s) 42*a-c*. (See, for example, the Background section above). Thus, in this embodiment, duration circuits 42*a-c* regulate the duration of a predetermined programming operation (for example, the temporal characteristics of the control signals to implement write, restore and/or refresh operations) for predetermined memory cell(s) 12.

Figure 14:
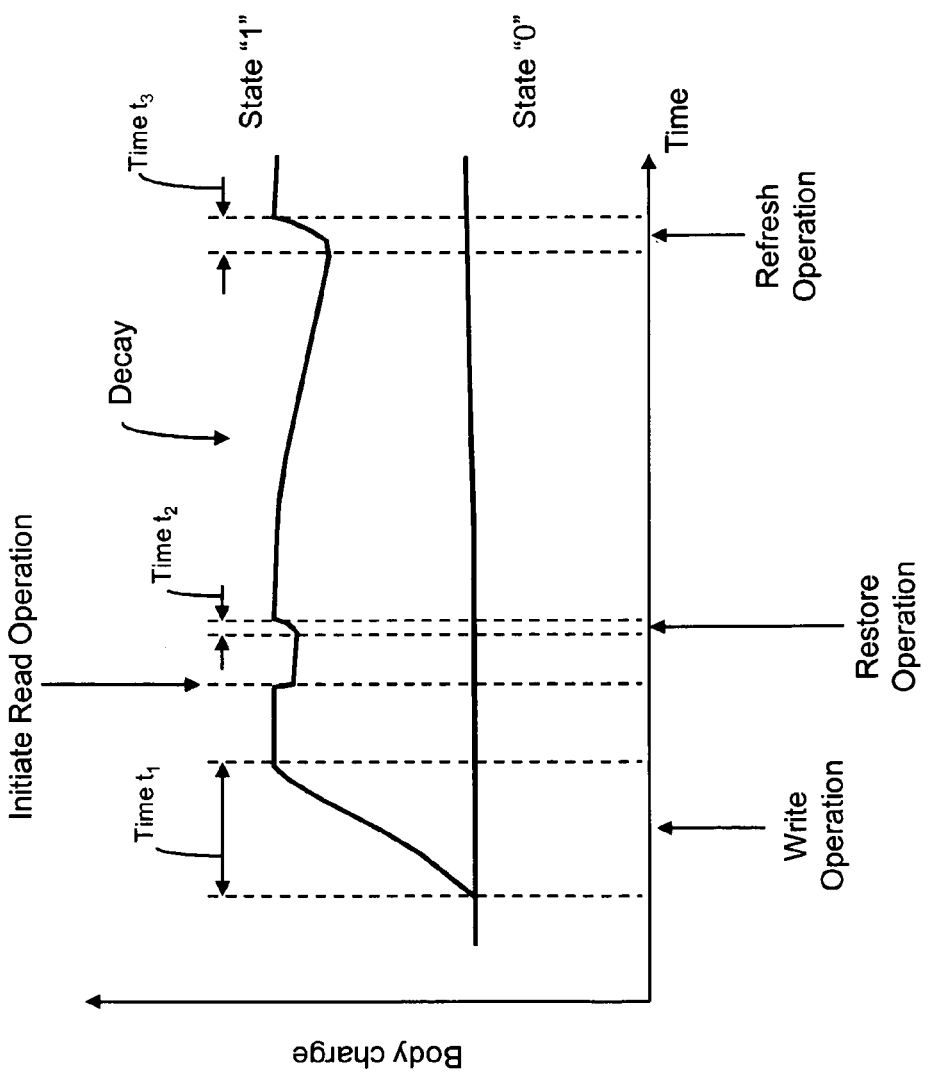
FIG. 14 illustrates changes in charge in the electrically floating body region over time caused by conventional reading and variable writing (programming) operations in conjunction with a plurality of different durations for implementing different write operations including (a) write data state "1" operation, (b) restore operation and (c) refresh operation, according to one aspect of the present inventions.

Notably, a write data state "1" operation or cycle may be described as programming or storing a data state "1" into a memory cell (for example, where the previous state of memory cell was unspecified or contained a data state "0"). Therefore, it may be assumed that the previous state was data state "0" in order to ensure that enough majority carriers are accumulated in the electrically floating body region of the memory cell to achieve a proper data "1" state. (See, for example, "Time $t_1$" in FIG. 14).

Further, a restore operation or cycle may be described as an operation that is performed after a read operation or cycle in order to compensate for any charge degradation due to the performance of the read operation, for example, charge pumping. This degradation is typically a minor degradation (in relation to a write operation or cycle); therefore the program duration may be reduced in relation to a write data state "1" operation because significantly less program time may be required to accumulate the small number of majority carriers that were "lost" due to implementing a read operation or cycle (for example, as a result of the charge pumping phenomenon). (See, for example, "Time $t_2$" in FIG. 14). In this way, the reduction in program duration between such memory operations may improve power and speed performance.

A refresh operation or cycle may be described as an operation that is performed to counteract a change in the physical parameter of the memory cell which varies with time, for example, to compensate for charge degradation due to leakage and recombination. Because the refresh operation or cycle is performed before the degradation of charge stored in the electrically floating body of the transistor 14 renders the state of the memory cell 12 unknown, the duration of the refresh operation or cycle may be less than that for a write operation or cycle but more than for a restore operation or cycle. (See, for example, "Time $t_3$" in FIG. 14). As mentioned above, the reduction in program duration between the refresh operation and a write operation may improve power and speed performance because of the ability to tailor, control and/or program the duration of the refresh operation.

In one embodiment, duration circuit 42*a* is programmed to provide a duration of the write data state "1" operation of 5-30 nanoseconds (and preferably between 10-20 nanoseconds); duration circuit 42*b* is programmed to provide a duration of the restore operation of 1-30 nanoseconds (and preferably between 2-5 nanoseconds); and duration circuit 42*c* is programmed to provide a duration of the refresh operation of 3-10 nanoseconds (and preferably between 5-8 nanoseconds). In this way, the reduced/controllable/programmable operation or cycle times for restore and refresh may result in improved power and speed performance. Indeed, since a restore operation is required after each read operation and a refresh operation is required periodically, the performance gain may be significant.

Notably, the duration of the operation may be determined using unique/specific or general/averaged empirical data, test data and/or theoretical or mathematical relationships. All techniques for determining a suitable duration of the operation, whether now known or later developed, are intended to fall within the scope of the present inventions.

Figure 15A:
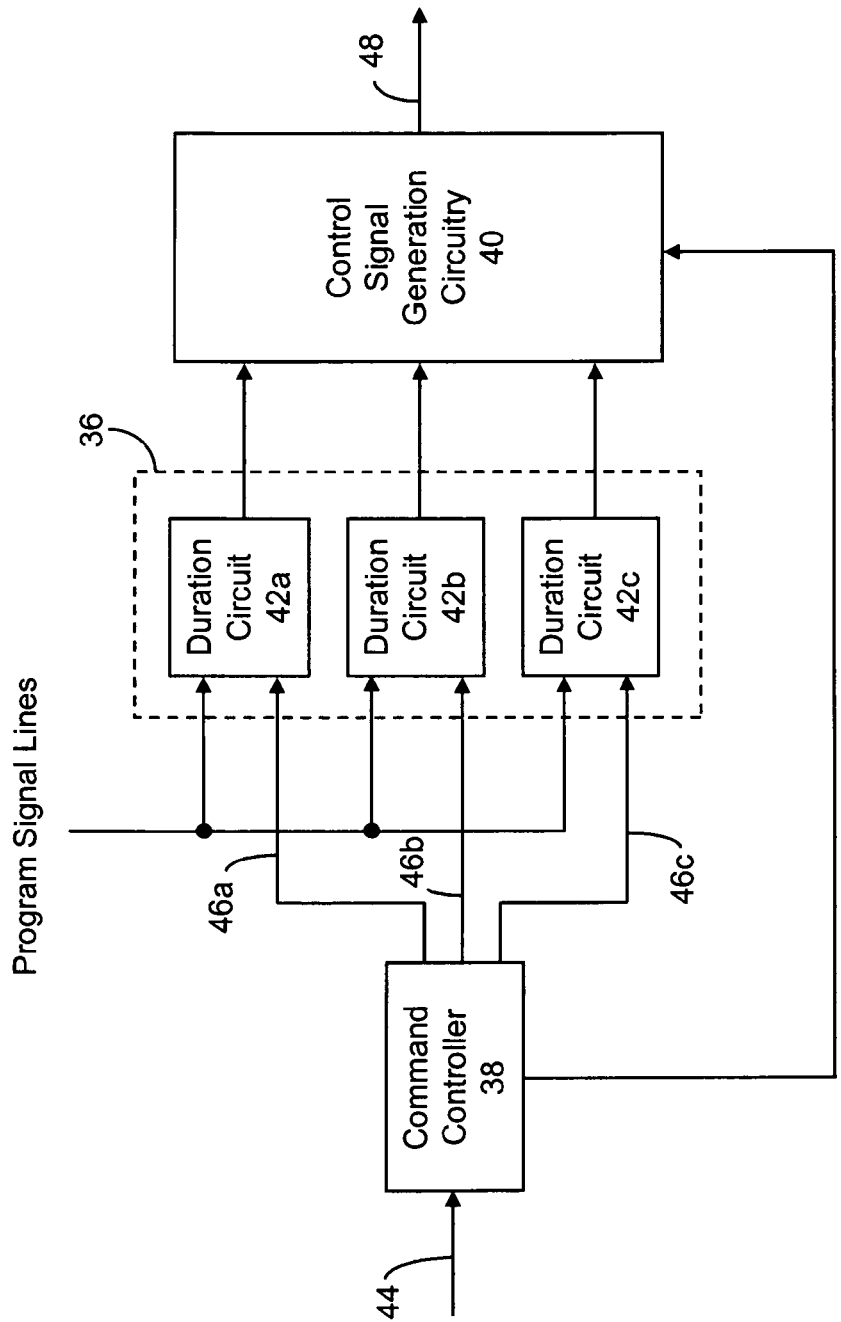
FIGS. 15A-15C are schematic representations of an embodiment of the programmable duration circuitry of FIG. 12, in conjunction with a command controller and control signal generation circuitry, wherein the programmable duration circuitry includes a plurality of duration circuits that may be individually programmed (via, for example, external circuitry or command controller) to provide a programmable/controllable duration of a plurality of different memory operations (for example, operations to write data state "1", restore and/or refresh operations), according to one aspect of the present inventions; in one embodiment the duration control information may be stored in the duration circuits (FIG. 15A), and, in other embodiments, the duration control information may be stored in a duration storage register (FIGS. 15B and 15C)

The duration circuits 42 may be one time programmable (for example, programmed during test or at manufacture) or more than one time programmable (for example, during test, start-up/power-up, during an initialization sequence and/or during operation (in situ)). For example, in one embodiment, the duration control information may be "stored" in circuitry that resides within each of duration circuit 42 (for example, fuses or anti-fuses, or DRAM, SRAM, ROM, PROM, EPROM, EEPROM cells and/or fixed delay circuits). (See, for example, FIG. 15A). In another embodiment, duration control information may be provided to and/or stored in duration circuitry 42 via program signal lines. Where, for example, fuses or anti-fuses are employed, other techniques are (or will be in view of this disclosure) well known to those skilled in the art.

Figure 15B:
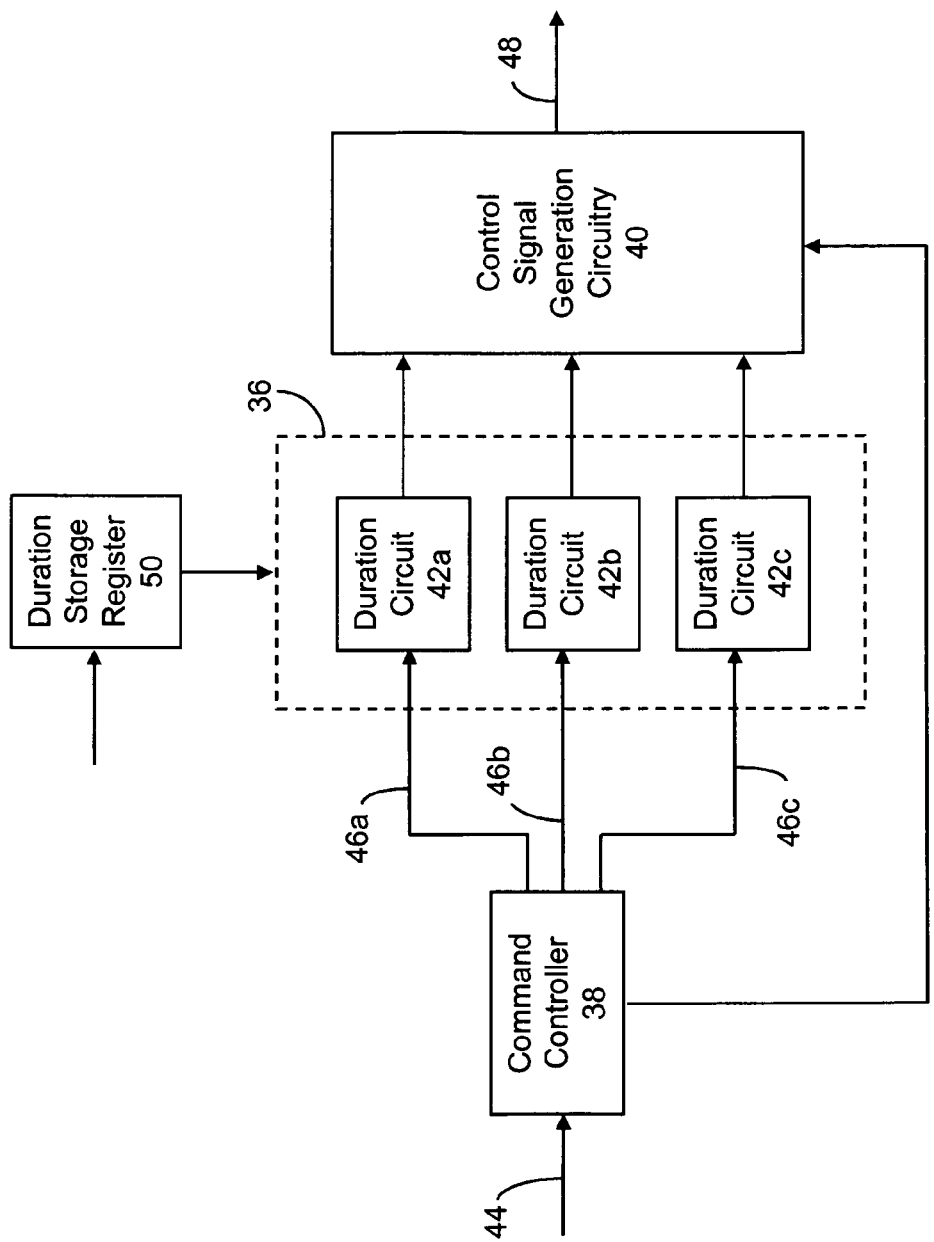
Figure 15C:
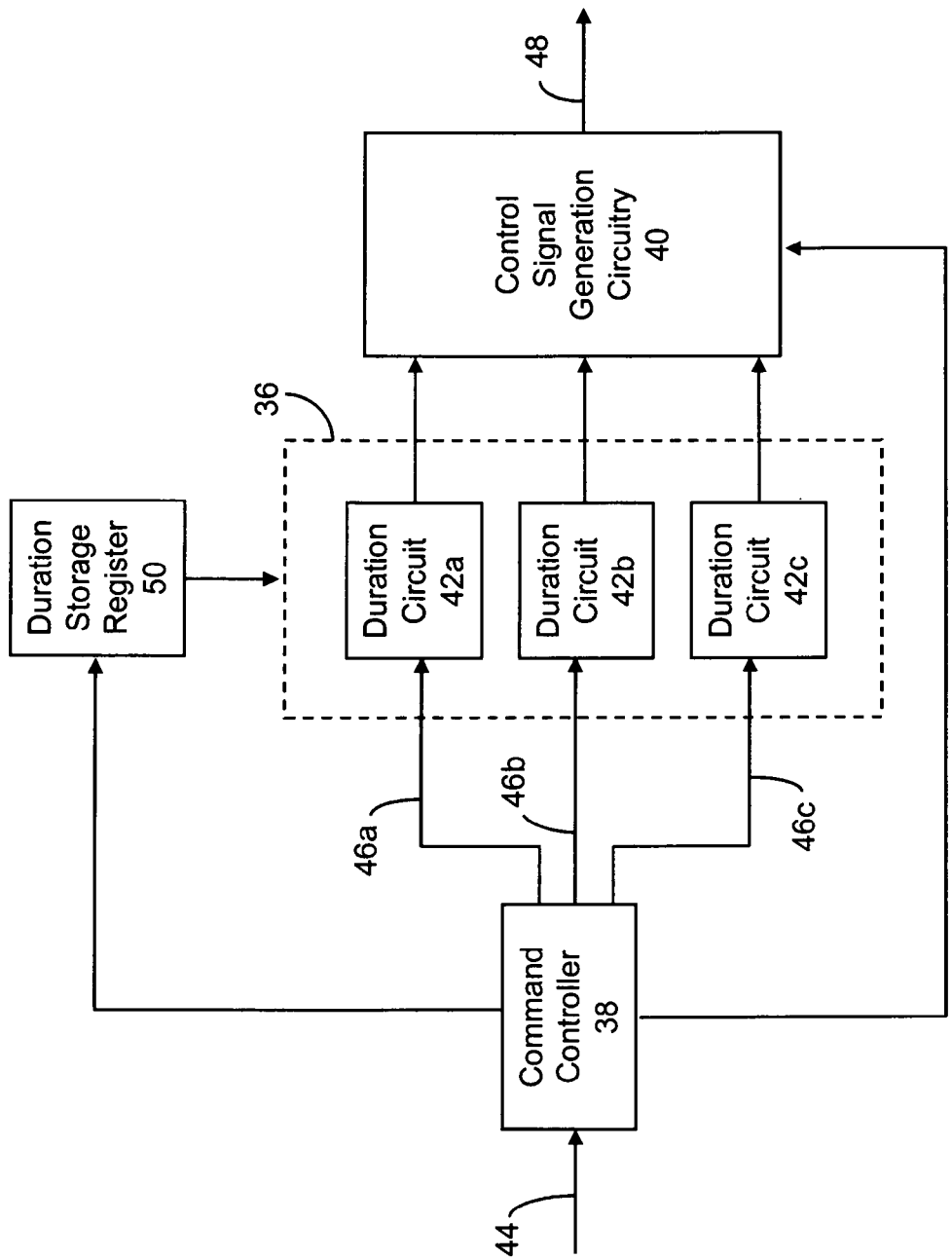

In yet another embodiment, duration control information may be stored in duration storage register circuitry 50. In this embodiment, the duration control information may be provided to duration circuits 42*a-c*, for example, at start-up/power-up and/or during an initialization sequence. (See, for example, FIGS. 15B and 15C). The duration control information may be determined via a particular configuration of the state of a certain pin or pins on the package of the device, or via external circuitry or an external device. (See, for example, FIG. 15B). Alternatively, the duration control information may be provided by command controller 38 at, for example, start-up/power-up, during an initialization sequence and/or during operation. (See, for example, FIG. 15C).

The duration storage register circuitry 50 may be a permanent, semi-permanent or temporary (i.e., until re-programmed) storage device, for example, a DRAM, SRAM, ROM, PROM, EPROM, EEPROM cells that are resident on (i.e., integrated in) the device. As mentioned above, duration storage register circuitry 50 may be controlled by command controller 38, via the state of fuses or anti-fuses, by pin configurations or states, or by circuitry that resides off-chip (for example, disposed on a memory card on which the memory device resides).

In one embodiment, in operation, one or more of duration circuits 42 and/or duration storage register circuitry 50 may be periodically and/or intermittently re-programmed in order to provide an enhanced, optimum, desired and/or predetermined duration of a given memory operation (for example, restore and refresh memory operations). In this regard, in one embodiment, command controller 38 and/or control circuitry (which is off-chip) may periodically and/or intermittently re-program the duration to be implemented by one or more of duration circuits 42. In this way, the duration of a given operation may be adjusted or re-programmed to provide an enhanced, optimum, desired and/or predetermined duration for a memory operation (for example, write, refresh or restore). As such, the power and/or speed performance of a given memory device may be periodically and/or intermittently improved via adjusting or reprogramming of duration circuits 42.

Notably, command controller 38 and/or control circuitry (which may be on-chip or off-chip) may employ any programming algorithm whether now known or later developed to provide an enhanced, optimum, desired and/or predetermined duration for a memory operation (for example, write, refresh and/or restore).

Figure 16A:
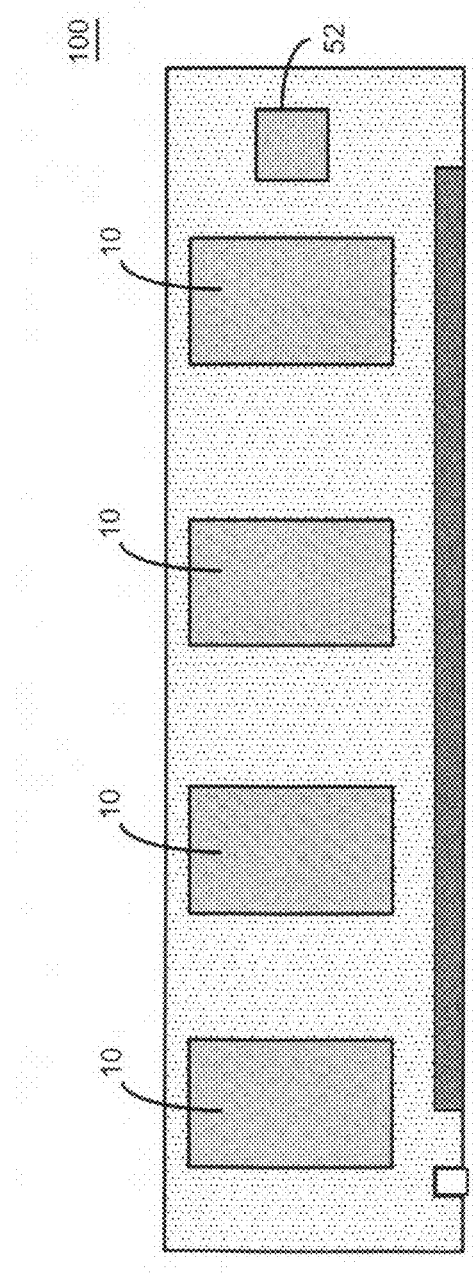
FIGS. 16A-16C are schematic representations of exemplary architectures and/or embodiments of implementing a controller/processor in conjunction with memory devices having programmable duration circuitry, in accordance with the present inventions.
Figure 16B:
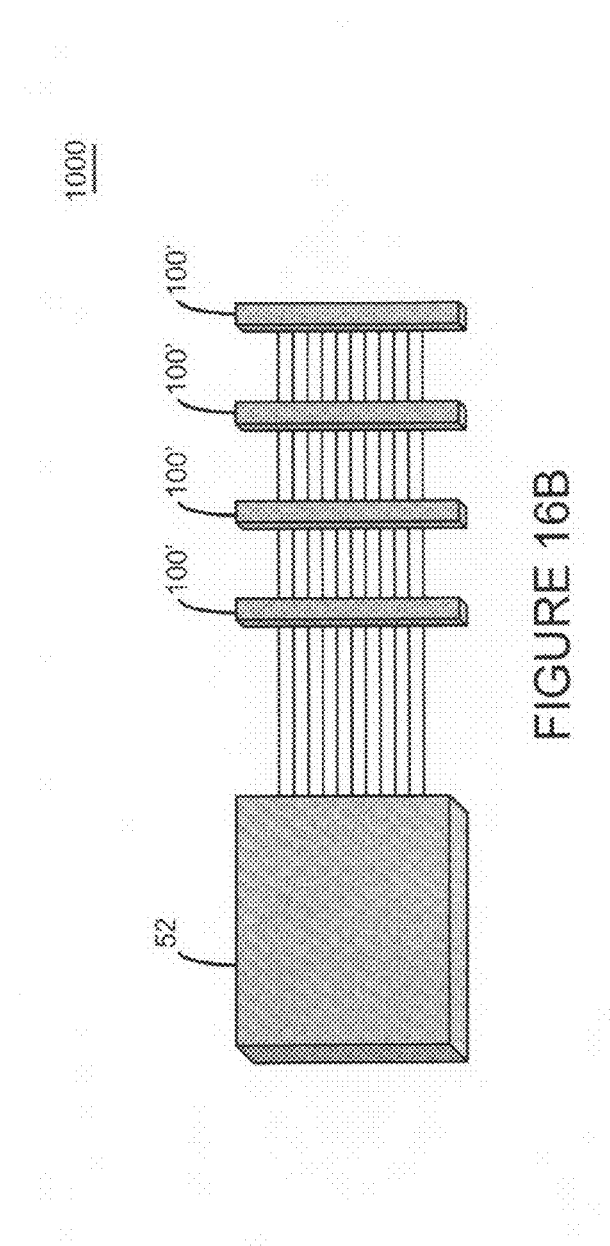
Figure 16C:
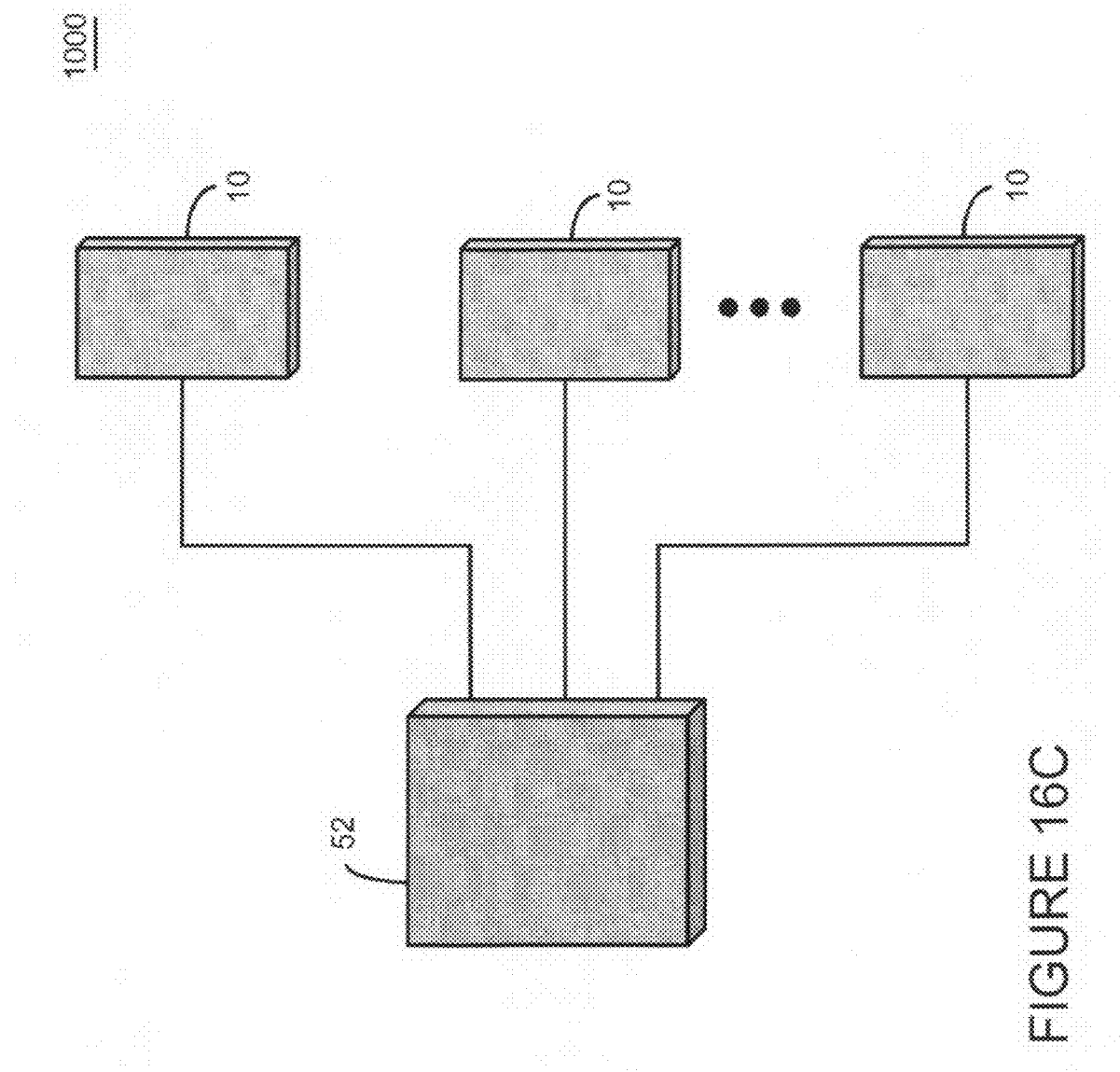

With reference to FIGS. 16A-16C, control circuitry (which, in this embodiment, is off-chip) may be implemented in external controller/processor 52 (for example, memory controller, microprocessor and/or graphics processor). The external controller/processor 52 may be implemented on module 100 (see, for example, FIG. 16A), in system 1000 having a distributed bus architecture (see, for example, FIG. 16B), and/or in system 1000 having a point-point architecture (see, for example, FIG. 16C). In each embodiment, controller/processor 52 may provide information to memory device 10 which, in response, controls the duration of a memory operation (for example, write, refresh or restore).

Figure 16D:
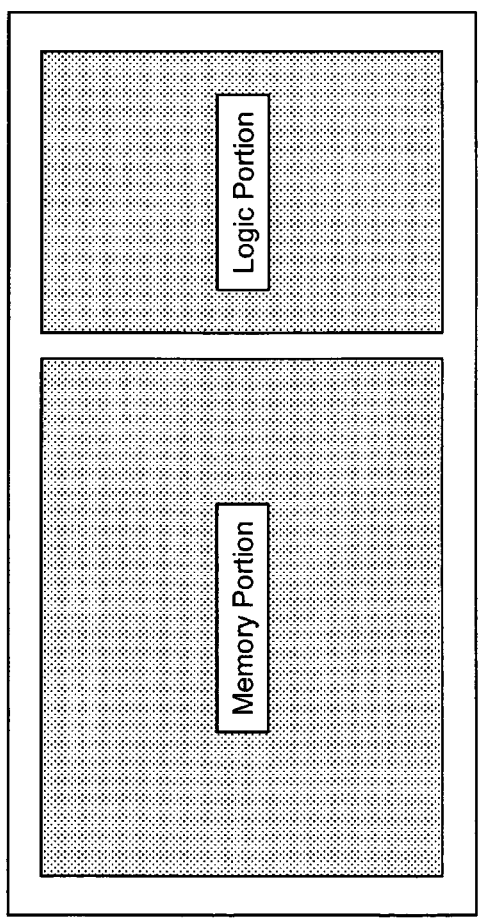
FIGS. 16D and 16E are schematic block diagram illustrations of exemplary integrated circuit devices in which the memory cell array (and certain peripheral circuitry) may be implemented, according to certain aspects of the present inventions.
Figure 16E:
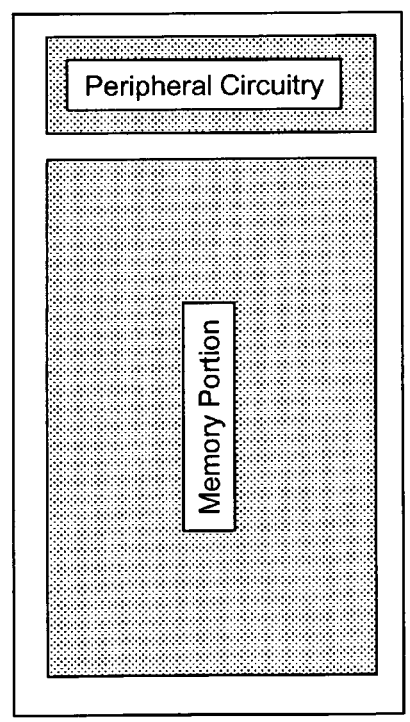

As noted above, the memory cell and/or memory cell array, as well as the circuitry of the present inventions may be implemented in an integrated circuit device having a memory portion and a logic portion (see, for example, FIG. 16D), or an integrated circuit device that is primarily a memory device (see, for example, FIG. 16E). The memory array may include a plurality of memory cells arranged in a plurality of rows and columns wherein each memory cell includes an electrically floating body transistor. The memory arrays may be comprised of N-channel, P-channel and/or both types of transistors. Indeed, circuitry that is peripheral to the memory array (for example, data sense circuitry (for example, sense amplifiers or comparators), memory cell selection and control circuitry (for example, word line and/or source line drivers), as well as row and column address decoders) may include P-channel and/or N-channel type transistors.

Figure 16F:
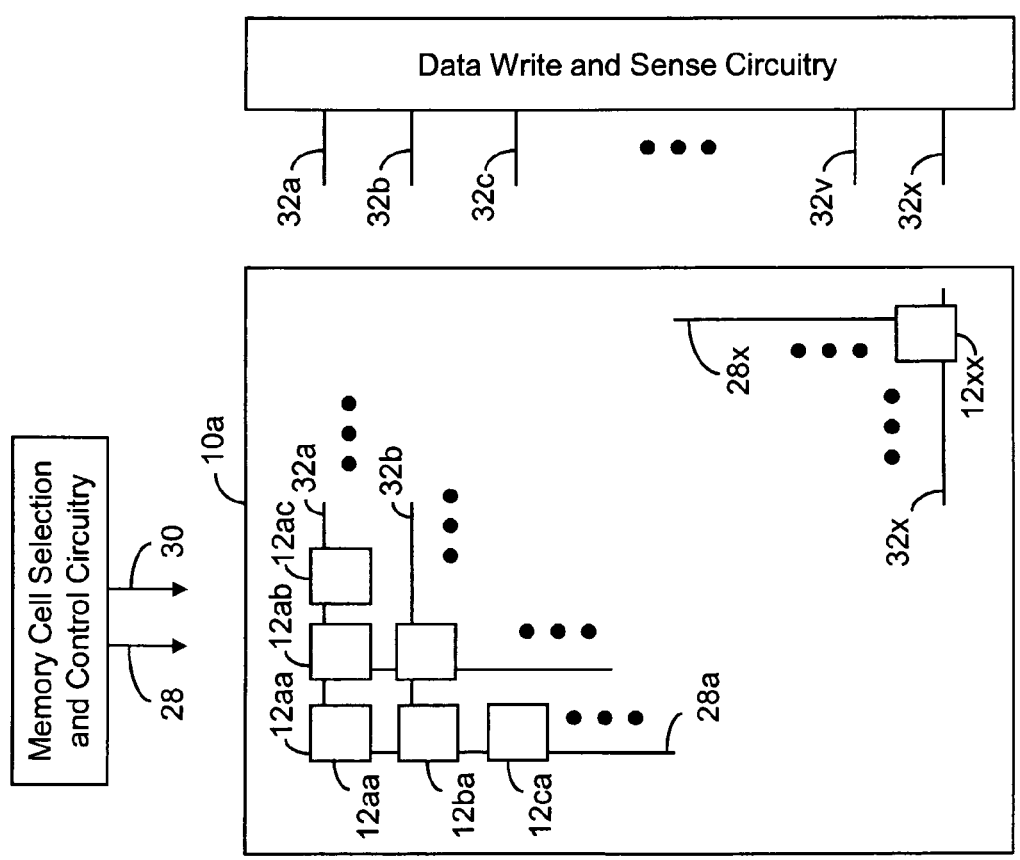
FIGS. 16F and 16G are schematic block diagrams of embodiments of an integrated circuit device including, among other things, a memory cell array, data sense and write circuitry, memory cell selection and control circuitry, according to certain aspects of the present inventions.
Figure 16G:
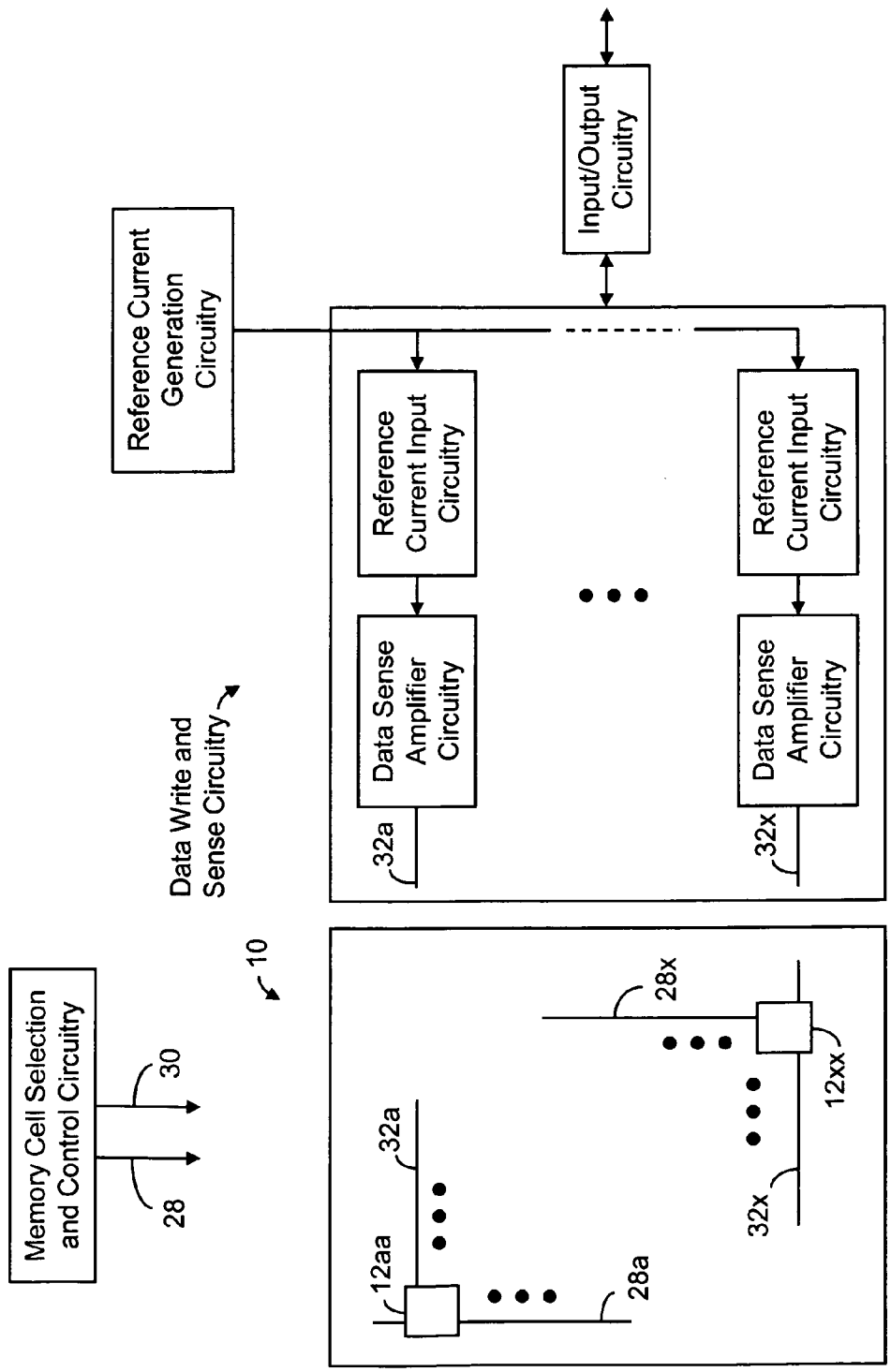

For example, with reference to FIGS. 16F and 16G, the integrated circuit device may include array 10, having a plurality of memory cells 12, data write and sense circuitry 36, and memory cell selection and control circuitry 38. The data write and sense circuitry 36 reads data from and writes data to selected memory cells 12. In one embodiment, data write and sense circuitry 36 includes a plurality of data sense amplifiers. Each data sense amplifier receives at least one bit line 32 and an output of reference generator circuitry (for example, a current or voltage reference signal). In one embodiment, the data sense amplifier may be a cross-coupled type sense amplifier as described and illustrated in the Non-Provisional U.S. patent application Ser. No. 11/299,590 (U.S. Patent Application Publication US 2006/0126374), filed by Waller and Carman, on Dec. 12, 2005, and entitled "Sense Amplifier Circuitry and Architecture to Write Data into and/or Read Data from Memory Cells", the application being incorporated herein by reference in its entirety) to sense the data state stored in memory cell 12 and/or write-back data into memory cell 12.

As mentioned above, in one aspect, the present inventions are directed to independently controllable parameters, for a given memory operation (for example, restore, write, refresh), to program or write a predetermined data state into a memory cell (for example, programming or writing data state "1" in a memory cell). In one embodiment, the controllable parameter is the amplitude of the voltage of the control signals applied to the gate, drain region and/or source region during programming or writing a predetermined data state into a memory cell (for example, write data state "1", restoring the data state after a read operation, and/or a refresh operation).

With reference to FIGS. 17A-17E, in this embodiment, programmable voltage circuitry 54 is employed to control the amplitude of the voltage of one or more control signals applied to the gate, drain region and/or source region during programming or writing a predetermined data state into a memory cell. The programmable voltage circuitry 54 may include a plurality of program voltage circuits 56a-x which are employed to provide voltage amplitude information to control signal generation circuitry 40 to implement one or more memory operations (for example, write data state "1", restoring the data state after a read operation, and/or a refresh operation). As noted above, control signal generation circuitry 40 (for example, a write controller), in response, to the output of the active programmable duration circuits 42a-x, generates suitable control signals, having the voltage amplitude characteristic, which is representative thereof, to implement the predetermined programming operation (for example, write, refresh or restore). In this way, the integrated circuit may observe an improved power and speed performance because of the ability to tailor, control and/or program, for example, the voltages employed in implementing certain memory operations (for example, restore, write and refresh operations).

Figure 17A:
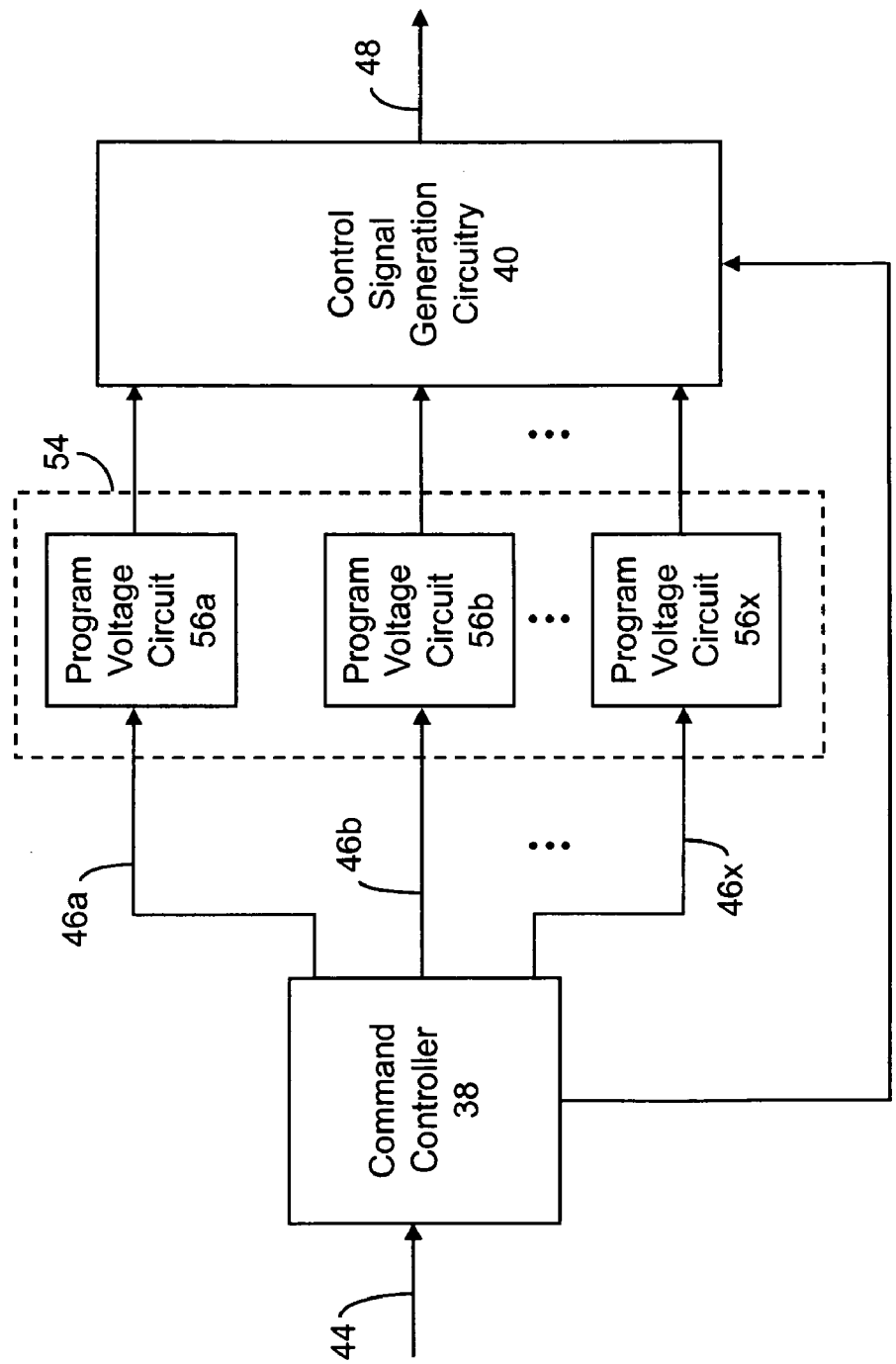
FIGS. 17A-17E are schematic representations illustrating embodiments of the programmable voltage circuitry, in conjunction with a command controller and control signal generation circuitry, wherein the programmable voltage circuitry includes a plurality of programmable voltage circuits to provide a programmable/controllable voltage for a plurality of different memory operations (for example, operations to write data state "1", restore and/or refresh operations), according to one aspect of the present inventions.
Figure 17B:
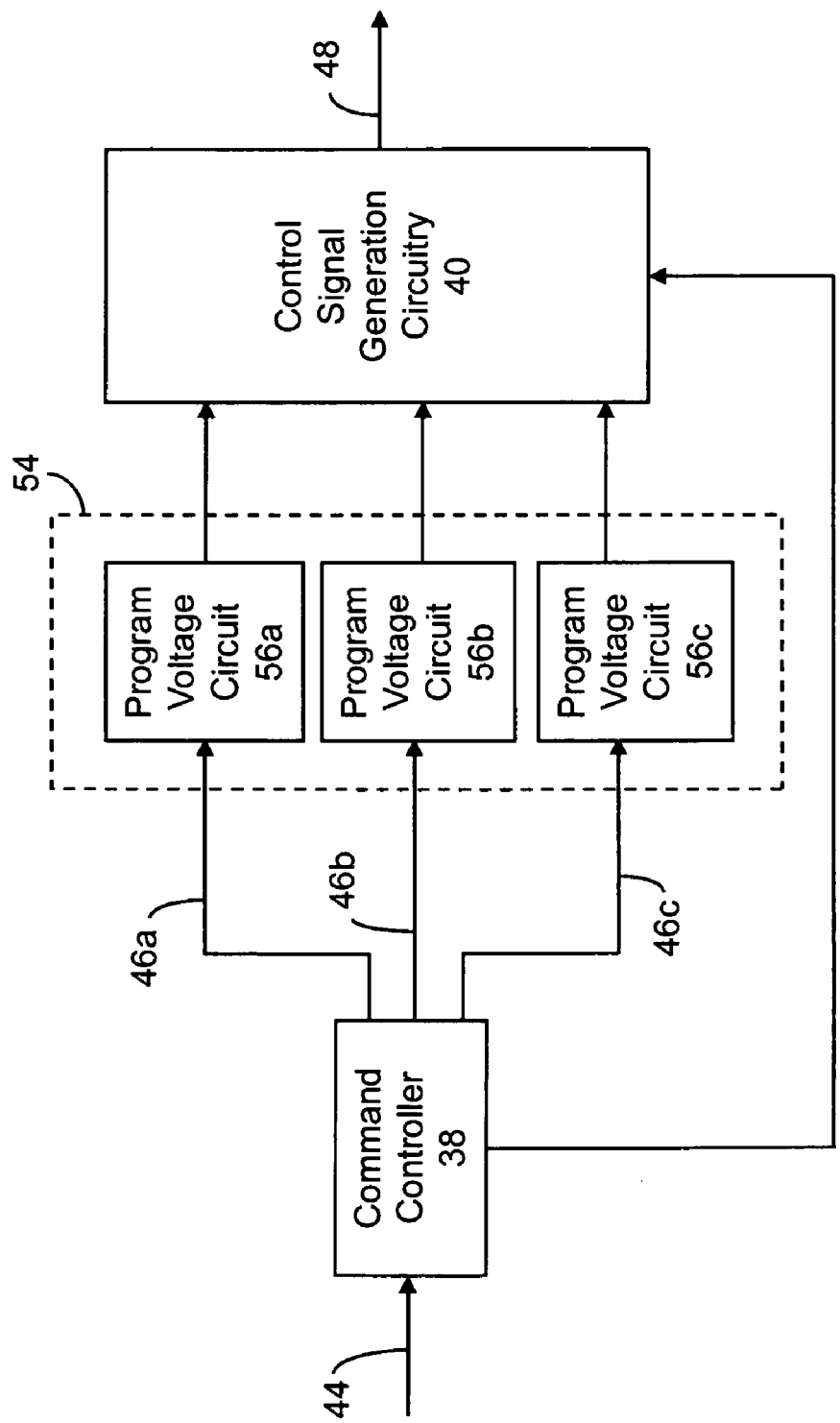
Figure 17C:
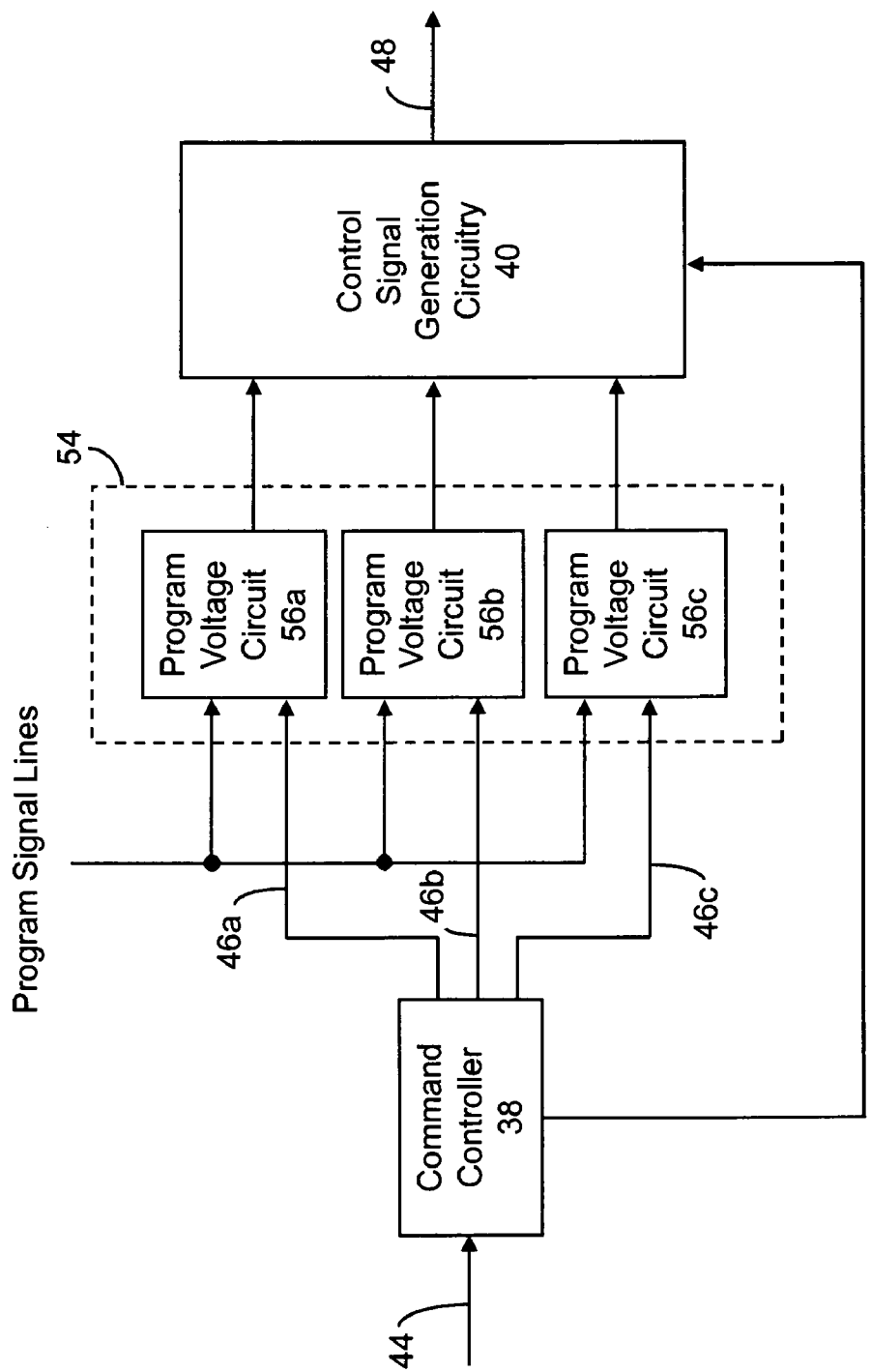
Figure 17D:
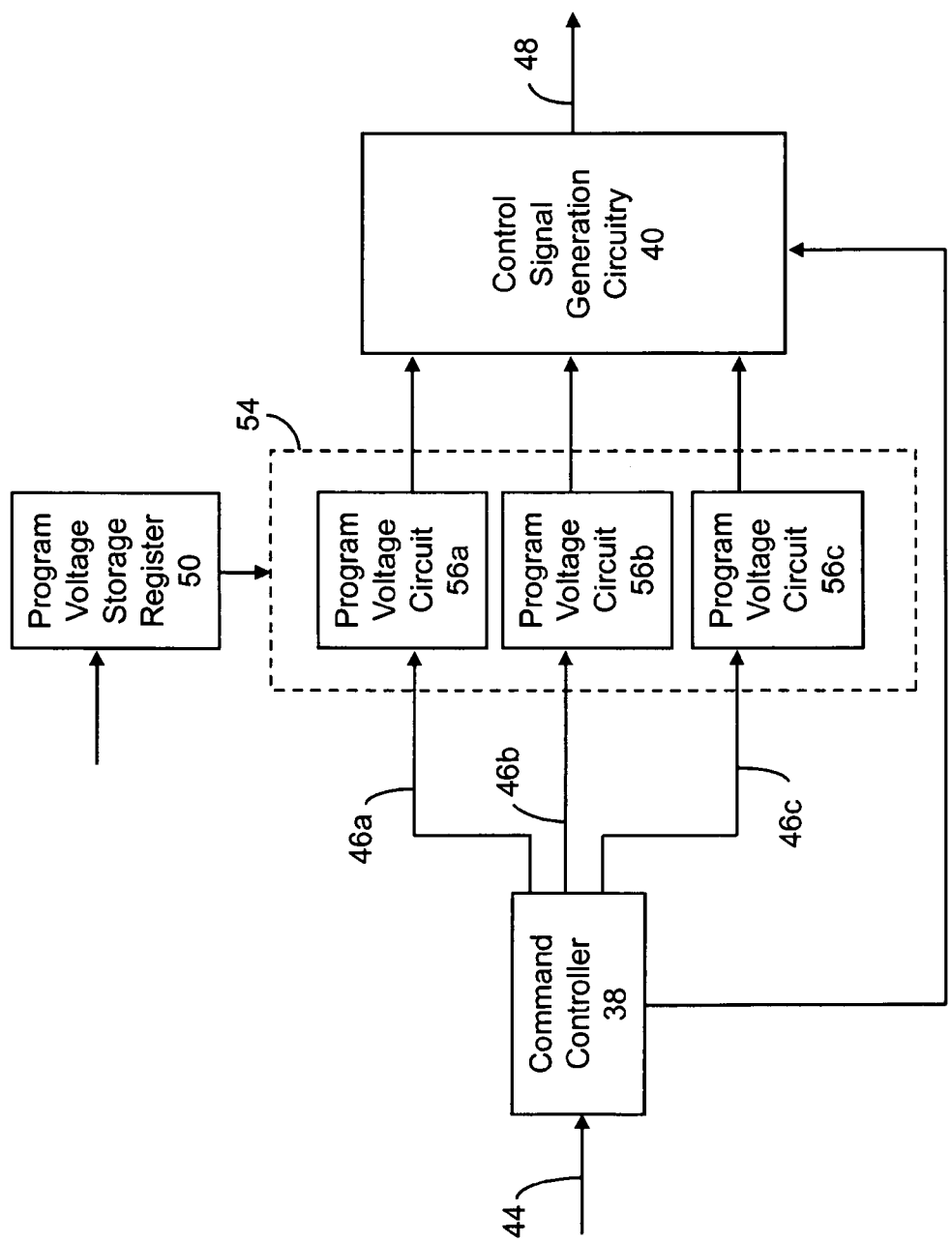
Figure 17E:
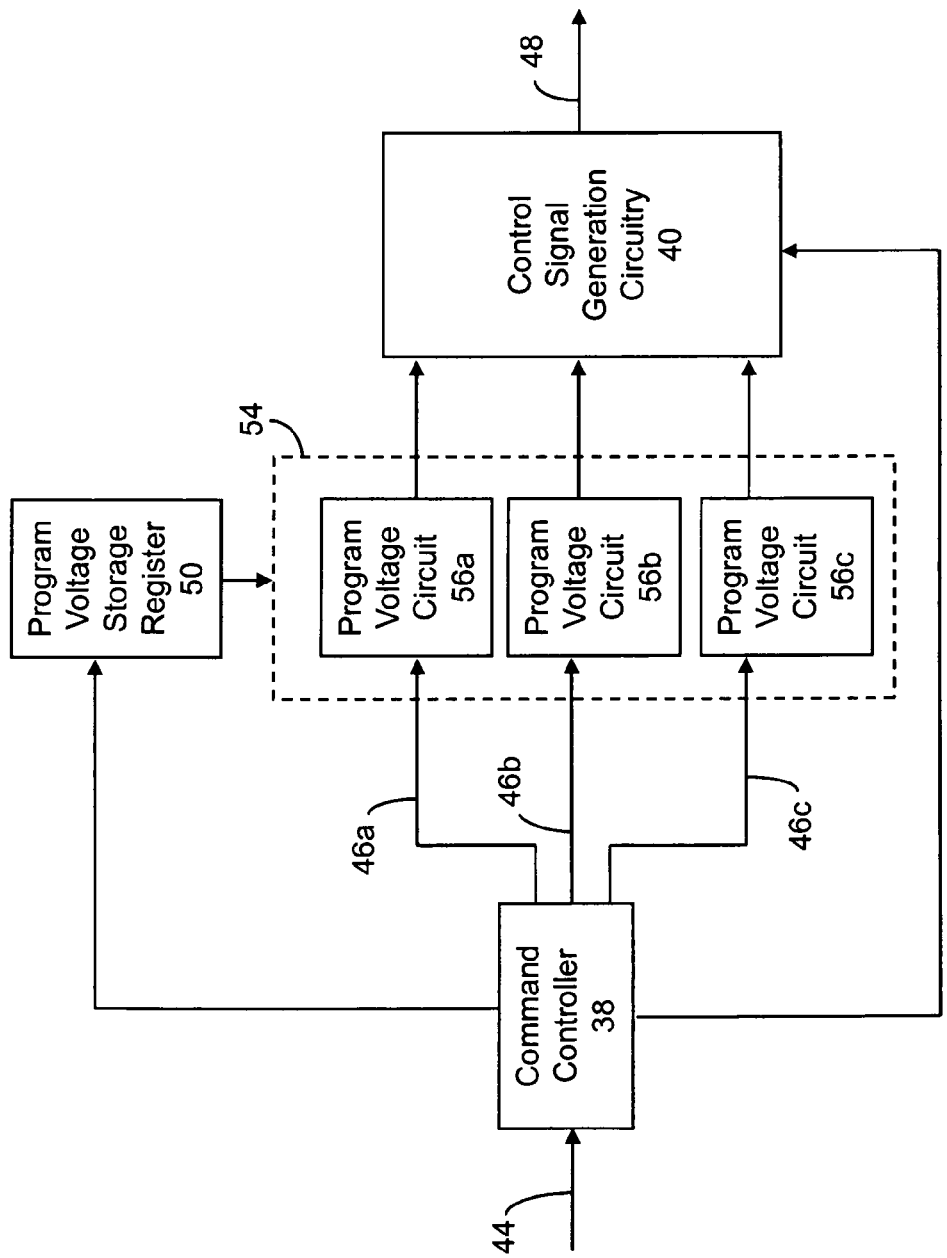

With reference to FIG. 17B, in one embodiment, programmable duration circuitry 36 includes three programmable voltage circuits 56a-c. In this embodiment, programmable voltage circuits 56a provides one or more signals which correspond to an amplitude of the programming voltage(s) for writing a logic state "1" into a memory cell. The programmable voltage circuit 56b provides one or more signals which correspond to an amplitude of the programming voltage(s) for performing a restore memory operation. Further, programmable voltage circuit 56c provides one or more signals which correspond to an amplitude of the programming voltage(s) for performing a refresh memory operation.

Notably, the entire discussion above, relative to the programmability of duration circuits 42, is entirely applicable to programmable voltage circuits 56 (for example, one time programmable such as during test or at manufacture, or more than one time programmable such as, during test, start-up/power-up, during an initialization sequence and/or during operation (for example, in situ)). (See, for example, FIGS. 17C-17E). For the sake of brevity, those discussions will not be repeated but are incorporated by reference herein.

Indeed, as with the embodiments pertaining to the controllable programming duration, the programming voltage levels of a given operation may be determined using unique/specific or general/averaged empirical data, test data and/or theoretical or mathematical relationships. All techniques for determining suitable programming voltage levels of a memory operation, whether now known or later developed, are intended to fall within the scope of the present inventions.

The present inventions may be implemented in any electrically floating body memory cell and memory cell array. (See, for example, the Background section above). Indeed, in certain aspects, the present inventions are a memory array, having a plurality of memory cells each including an electrically floating body transistor, and/or technique of writing or programming data into one or more memory cells of such a memory array. In this aspect of the inventions, the data states of adjacent memory cells and/or memory cells that share a word line may be individually programmed.

The memory arrays may be comprised of N-channel, P-channel and/or both types of transistors. Indeed, circuitry that is peripheral to the memory array (for example, sense amplifiers or comparators, row and column address decoders, as well as line drivers (not illustrated herein)) may include P-channel and/or N-channel type transistors. Where P-channel type transistors are employed as memory cells 12 in the memory array(s), suitable write and read voltages (for example, negative voltages) are well known to those skilled in the art in light of this disclosure. Accordingly, for the sake of brevity, these discussions will not be repeated.

Moreover, the circuitry and techniques of the present inventions may be employed in conjunction with any electrically floating body memory cell (i.e., a memory cell including at least one electrically floating body transistor), and/or architecture, layout, structure and/or configuration employing such electrically floating body memory cells (among other types of memory cells). In this regard, an electrically floating body transistor, whose state is read, programmed and/or refreshed using the techniques of the present inventions, may be implemented in the memory cell, architecture, layout, structure and/or configuration described and illustrated in the following provisional and non-provisional U.S. patent applications:

(1) U.S. Non-Provisional patent application Ser. No. 10/450,238, which was filed by Fazan et al. on Jun. 10, 2003 and entitled "Semiconductor Device" (now U.S. Pat. No. 6,969,662);

(2) U.S. Non-Provisional patent application Ser. No. 10/487,157, which was filed by Fazan et al. on Feb. 18, 2004 and entitled "Semiconductor Device" (now U.S. Pat. No. 7,061,050);

(3) U.S. Non-Provisional patent application Ser. No. 10/829,877, which was filed by Ferrant et al. on Apr. 22, 2004 and entitled "Semiconductor Memory Cell, Array, Architecture and Device, and Method of Operating Same" (now U.S. Pat. No. 7,085,153);

(4) U.S. Non-Provisional patent application Ser. No. 11/096,970, which was filed by Ferrant et al. and entitled "Semiconductor Memory Device and Method of Operating Same" (now U.S. Pat. No. 7,085,156);

(5) U.S. Non-Provisional patent application Ser. No. 10/941,692, which was filed by Fazan et al. on Sep. 15, 2004 and entitled "Low Power Programming Technique for a One Transistor SOI Memory Device & Asymmetrical Electrically Floating Body Memory Device, and Method of Manufacturing Same" (U.S. Patent Application Publication No. 2005/0063224);

(6) U.S. Non-Provisional patent application Ser. No. 11/304,387, which was filed by Okhonin et al. on Dec. 15, 2005 and entitled "Bipolar Reading Technique for a Memory Cell Having an Electrically Floating Body Transistor" (U.S. Patent Application Publication No. 2006/0131650);

(7) U.S. Non-Provisional patent application Ser. No. 11/453,594, which was filed by Okhonin et al. on Jun. 15, 2006 and entitled "Method for Reading a Memory Cell Having an Electrically Floating Body Transistor, and Memory Cell and Array Implementing Same";

(8) U.S. Non-Provisional patent application Ser. No. 11/509,188, which was filed by Okhonin et al. filed on Aug. 24, 2006, and entitled "Memory Cell and Memory Cell Array Having an Electrically Floating Body Transistor, and Methods of Operating Same" (referred to above); and (9) U.S. Non-Provisional patent application Ser. No. 11/515,667, which was filed by Bauser on Sep. 5, 2006, and entitled "Method and Circuitry to Generate a Reference Current for Reading a Memory Cell, and Device Implementing Same".

The entire contents of these nine (9) U.S. patent applications, including, for example, the inventions, features, attributes, architectures, configurations, materials, techniques and advantages described and illustrated therein, are incorporated by reference herein. For the sake of brevity, those discussions will not be repeated; rather those discussions (text and illustrations), including the discussions relating to the memory cell, architecture, layout, structure, are incorporated by reference herein in its entirety.

Notably, the memory cells (having one or more transistors each including a strained electrically floating body region) may be controlled (for example, programmed or read) using any of the control circuitry described and illustrated in the above-referenced nine (9) U.S. patent applications. For the sake of brevity, those discussions will not be repeated and are incorporated herein by reference. Indeed, all memory cell selection and control circuitry, and techniques for programming, reading, controlling and/or operating memory cells including transistors having strained electrically floating body regions, whether now known or later developed, are intended to fall within the scope of the present inventions.

For example, the data stored in or written into memory cells 12 of DRAM array/device 10 may be read using well known circuitry and techniques (whether conventional or not), including those described in the above-referenced nine (9) U.S. patent applications. The present inventions may also employ the read circuitry and techniques described and illustrated in U.S. patent application Ser. No. 10/840,902, which was filed by Portmann et al. on May 7, 2004, and entitled "Reference Current Generator, and Method of Programming, Adjusting and/or Operating Same" (now U.S. Pat. No. 6,912, 150).

In addition, the present inventions may employ the read operation techniques described and illustrated in U.S. patent application Ser. No. 11/515,667, which was filed by Bauser on Sep. 5, 2006, and entitled "Method and Circuitry to Generate a Reference Current for Reading a Memory Cell, and Device Implementing Same". The entire contents of the U.S. patent application Ser. No. 11/515,667 are incorporated herein by reference.

Moreover, a sense amplifier (not illustrated) may be employed to read the data stored in memory cells 12. The sense amplifier may sense the data state stored in memory cell 12 using voltage or current sensing techniques. In the context of a current sense amplifier, the current sense amplifier may compare the cell current to a reference current, for example, the current of a reference cell (not illustrated). From that comparison, it may be determined whether memory cell 12 contained a logic high (relatively more majority carriers 34 contained within body region 18) or logic low data state (relatively less majority carriers 28 contained within body region 18). Such circuitry and configurations thereof are well known in the art.

It should be further noted that while each memory cell 12 in the exemplary embodiments (described above) includes one transistor 14, memory cell 12 may include two transistors, as described and illustrated in application Ser. No. 10/829,877, which was filed by Ferrant et al. on Apr. 22, 2004 and entitled "Semiconductor Memory Cell, Array, Architecture and Device, and Method of Operating Same" (U.S. Patent Application Publication No. 2005/0013163, now U.S. Pat. No. 7,085,153). As mentioned above, any of the architectures, layouts, structures and/or configurations, as well as the programming and reading operations described and illustrated in application Ser. No. 10/829,877 may be employed in conjunction with the inventions described and illustrated herein. For the sake of brevity, those discussions will not be repeated; rather, they are incorporated by reference herein.

Further, as noted above, the present inventions may be employed or implemented in conjunction with one or more of the inventions, memory cells, memory arrays and memory devices, and techniques for programming, reading, controlling and/or operating a semiconductor memory cell, array and device of the following provisional U.S. patent applications:

(1) U.S. Non-Provisional patent application Ser. No. 11/304,387, which was filed by Okhonin et al. on Dec. 15, 2004 and entitled "Bipolar Reading Technique for a Memory Cell Having an Electrically Floating Body Transistor" (U.S. Patent Application Publication No. 2006/0131650);

(2) U.S. Non-Provisional patent application Ser. No. 11/509,188, which was filed by Okhonin et al. filed on Aug.

24, 2006, and entitled "Memory Cell and Memory Cell Array Having an Electrically Floating Body Transistor, and Methods of Operating Same" (referred to above); and The entire contents of these two (2) U.S. applications, including, for example, the inventions, features, attributes, architectures, configurations, materials, techniques and advantages described and illustrated therein, are hereby incorporated by reference herein. For the sake of brevity, those discussions will not be repeated; rather those discussions (text and illustrations), including the discussions relating to the memory cell, architecture, layout, structure, are incorporated by reference herein in its entirety.

The electrically floating memory cells, transistors and/or memory array(s) may be fabricated using well known techniques and/or materials. Indeed, any fabrication technique and/or material, whether now known or later developed, may be employed to fabricate the electrically floating body memory cells, transistors and/or memory array(s). For example, the present inventions may employ silicon (whether bulk-type or SOI), germanium, silicon/germanium, gallium arsenide or any other semiconductor material in which transistors may be formed. Indeed, the electrically floating transistors, memory cells, and/or memory array(s) may employ the techniques described and illustrated in non-provisional patent application entitled "Integrated Circuit Device, and Method of Fabricating Same", which was filed on Jul. 2, 2004, by Fazan, Ser. No. 10/884,481 and/or non-provisional patent application entitled "One Transistor Memory Cell having a Strained Electrically Floating Body Region, and Method of Operating Same", which was filed on Oct. 12, 2006, and assigned Ser. No. 11/580,169, by Bassin (hereinafter collectively "Integrated Circuit Device Patent Applications"). The entire contents of the Integrated Circuit Device Patent Applications, including, for example, the inventions, features, attributes, architectures, configurations, materials, techniques and advantages described and illustrated therein, are hereby incorporated by reference herein.

Indeed, memory array 10 (including SOI memory transistors) may be integrated with SOI logic transistors, as described and illustrated in the Integrated Circuit Device Patent Applications. For example, in one embodiment, an integrated circuit device includes memory section (having, for example, PD or FD SOI memory transistors 14) and logic section (having, for example, high performance transistors, such as FinFET, multiple gate transistors, and/or non-high performance transistors (for example, single gate transistors that do not possess the performance characteristics of high performance transistors—not illustrated)). Again, the entire contents of the Integrated Circuit Device Patent Applications, including, for example, the inventions, features, attributes, architectures, configurations, materials, techniques and advantages described and illustrated therein, are hereby incorporated by reference.

Further, the memory arrays may be comprised of N-channel, P-channel and/or both types of transistors, as well as partially depleted and/or fully depleted type transistors. For example, circuitry that is peripheral to the memory array (for example, sense amplifiers or comparators, row and column address decoders, as well as line drivers (not illustrated herein)) may include fully depleted type transistors (whether P-channel and/or N-channel type). Alternatively, such circuitry may include partially depleted type transistors (whether P-channel and/or N-channel type). There are many techniques to integrate both partially depleted and/or fully depleted type transistors on the same substrate (see, for example, U.S. Non-Provisional patent application Ser. No. 10/487,157, which was filed by Fazan et al. on Feb. 18, 2004 and entitled "Semiconductor Device" (U.S. Patent Application Publication No. 2004/0238890). All such techniques, whether now known or later developed, are intended to fall within the scope of the present inventions.

Notably, electrically floating body transistor 14 may be a symmetrical or non-symmetrical device. Where transistor 14 is symmetrical, the source and drain regions are essentially interchangeable. However, where transistor 14 is a non-symmetrical device, the source or drain regions of transistor 14 have different electrical, physical, doping concentration and/or doping profile characteristics. As such, the source or drain regions of a non-symmetrical device are typically not interchangeable. This notwithstanding, the drain region of the electrically floating N-channel transistor of the memory cell (whether the source and drain regions are interchangeable or not) is that region of the transistor that is connected to the bit line/sense amplifier.

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the embodiments, features, attributes and advantages of the inventions described and illustrated herein are not exhaustive and it should be understood that such other, similar, as well as different, embodiments, features, attributes and advantages of the present inventions are within the scope of the present inventions.

For example, as mentioned above, the controllable parameters may be both temporal (the amount of time of programming or writing a predetermined data state into a memory cell for a given memory operation such as restore, write and/or refresh) and voltage amplitude (the amplitude of the voltage of one or more control signals). (See, for example, FIG. 18A). In this embodiment, parameter adjustment circuitry 58 includes a plurality of programmable parameter circuits 60a-x. The programmable parameter circuits 60a-x each include at least one of programmable duration circuits 42 and programmable voltage circuits 56 to provide a programmable/controllable duration and programmable/controllable voltage, respectively, for a plurality of memory operations (for example, operations to write data state "1", restore and/or refresh operations). Notably, the programmable parameter circuits 60a-x may include programmable duration circuit 42 and/or programmable voltage circuit 56. (See, FIG. 18B). All permutations and combinations of programmable duration circuit 42 and programmable voltage circuit 56 are intended to fall within the scope of the present inventions. For the sake of brevity, all such permutations and combinations are not discussed in detail herein.

Figure 18A:
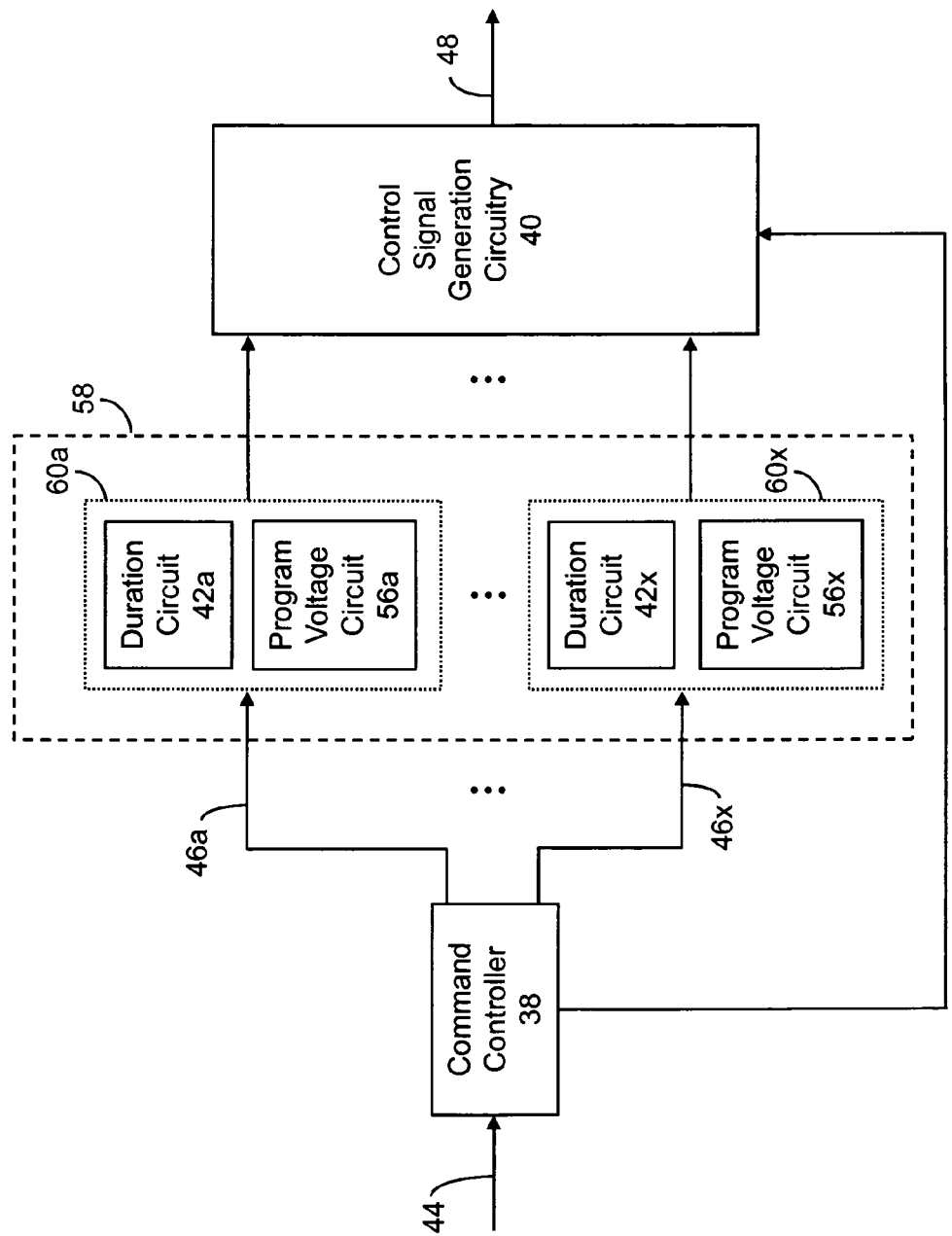
FIGS. 18A and 18B are schematic representations illustrating embodiments of the parameter adjustment circuitry, including a plurality of programmable parameter circuits, in conjunction with a command controller and control signal generation circuitry (for example, a write controller), wherein the plurality of programmable parameter circuits, each include at least one of programmable voltage circuits and/or programmable duration circuits to provide a programmable/controllable voltage and/or programmable/controllable duration (respectively) for a plurality of memory operations (for example, operations to write data state "1", restore and/or refresh operations), according to one aspect of the present inventions.
Figure 18B:
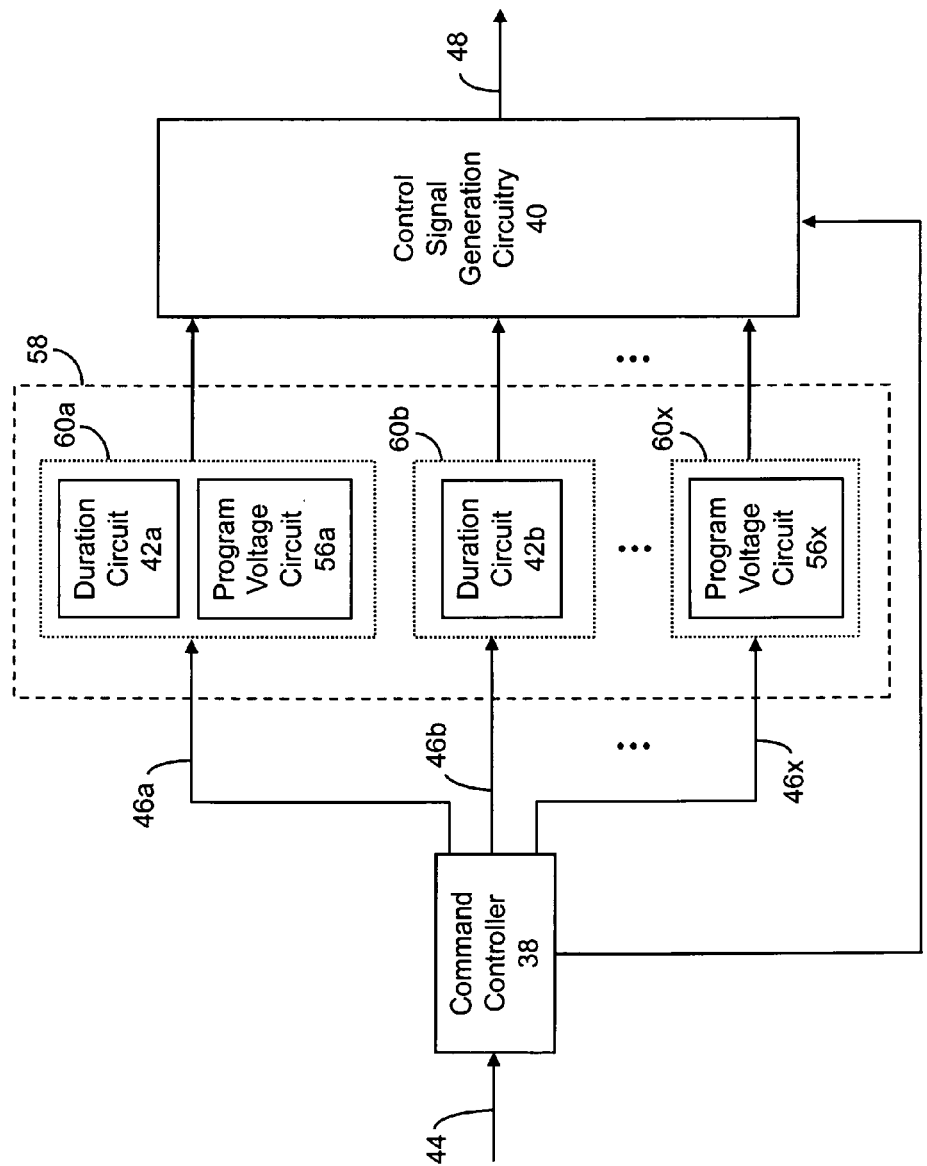

The entire discussion above, relative to the programmability of duration circuits 42 and voltage circuits 56, is entirely applicable to the embodiments of FIGS. 18A and 18B. For the sake of brevity, those discussions will not be repeated but are incorporated by reference herein.

Further, although illustrated as different elements or circuitry, certain circuitry of programmable duration circuitry 36 and certain circuitry of command controller 38 may be "combined" into one or more circuitry block which, among other things, generates suitable control signals (for example, to perform write/program operations) for a duration that is based on the output of the active duration circuit(s) 42a-c. As discussed below, such a circuitry block may be among other things, a state machine, microprocessor, microcontroller, discrete logic, and/or programmable gate array.

Moreover, the programmable duration circuitry may employ analog and/or digital circuitry and techniques to implement the inventions. For example, with reference to FIG. 19, in one embodiment, a programmable timer (for example, a counter) may be employed to provide temporal data to a digital controller circuitry (for example, a state machine, microprocessor, microcontroller, discrete logic, and/or programmable gate array) which generates control signals that are applied to control signal generation circuitry 40. In response, control signal generation circuitry 40 generates suitable/appropriate write signals on program signal lines 48. In this embodiment, the digital controller circuitry selects the appropriate temporal data, via SEL_REG, which controls which input of the multiplexer is applied to programmable timer. The programmable timer "counts" to a predetermined value and outputs temporal data to digital controller circuitry (i.e., CNTDONE) and, in response, digital controller circuitry generates a pulse having a length which is representative of the temporal data. (See, the exemplary timing diagram in FIG. 20).

Figure 19:
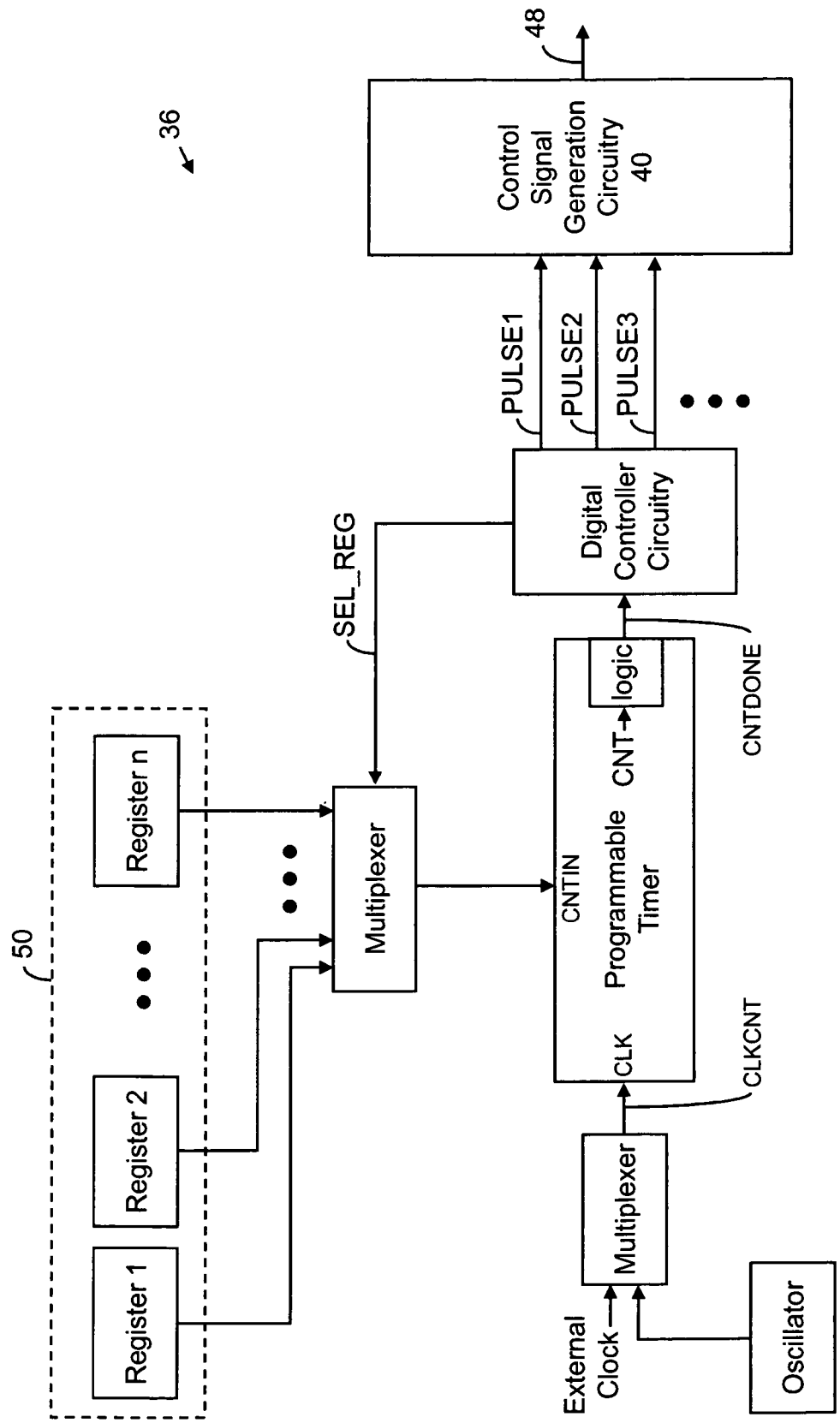
FIG. 19 is a schematic representation illustrating programmable duration circuitry, in conjunction with a control signal generation circuitry (for example, a write controller), which is employed to implement a programmable/controllable duration of a write operation (for example, operations to write a given data state, restore and/or refresh operations), according to one aspect of the present inventions.
Figure 20:
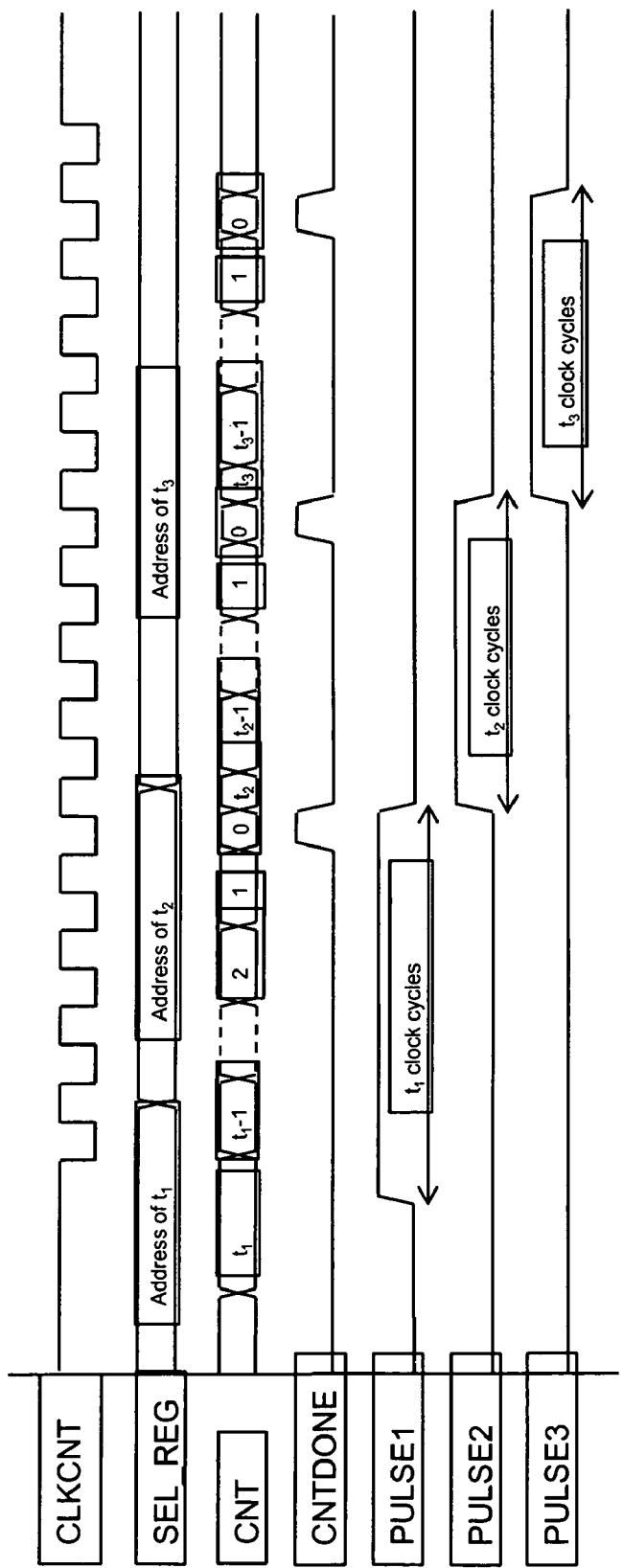
FIG. 20 is an exemplary timing diagram, according to certain aspects of the present inventions, relating to certain operations of the programmable duration circuitry of FIG. 19.

In particular, with reference to FIGS. 19 and 20, the programmable timer generates several pulses on the output CNTDONE that will be used by the digital controller to generate the series of variable control pulses PULSE 1, PULSE 2, PULSE 3, etc. The time period between each pulse on CNTDONE is determined by a number of periods (t1, t2 ... tn) of the clock input CLKCNT of the programmable timer. The duration of each time period is determined or controlled by the data stored in at least one of the registers of duration storage register circuitry 50.

The programmable timer may be initialized with the number of clocks corresponding to the duration of the first control pulse t1, by setting the register number on SEL_REG that stores the first time duration t1. Accordingly, in this embodiment, the digital controller circuitry selects the appropriate register (which is determined by the selected/desired program operation). Notably, the digital controller circuitry may generate or provide other control signals (not illustrated); for example, digital controller circuitry may reset certain circuitry and load the programmable timer with the appropriate data (via CNTIN).

An oscillator may provide a repetitive signal that drives the programmable timer. Notably, an external clock TCLK may be selected during, for example, testing.

The programmable timer may count up or down. In this exemplary/illustrative embodiment, programmable timer decrements in response to the clock CLKCNT on each falling edge. The output count value may be provided to logic circuitry (for example, a NOR gate) to detect a zero value which responsively asserts the signal CNTDONE. The digital controller circuitry, at the end of the first control pulse duration, terminates the program operation.

Notably, in this embodiment, the PULSEn output signals are provided to control signal generation circuitry 40 (for example, a write controller) to generate the control signals to implement write, restore and/or refresh operations) for predetermined memory cell(s) 12 wherein such control signals have the appropriate temporal characteristics for a predetermined programming operation.

With continued reference to FIG. 19, in this embodiment duration storage register circuitry 50 may include a plurality of registers, each register storing control information which is representative of one or more temporal characteristics of one or more memory or program operations (for example, restore, write and refresh). The discussion above, relative to duration storage register circuitry 50 is applicable here; for the sake of brevity, such discussion will not be repeated.

Where the events to be controlled are sequential, a single programmable timer and digital controller circuit may be employed. Under these circumstances, a bank of registers may be used for each of the write, restore and refresh operations.

Notably, while certain portions of this description (text and illustrations) refer to memory operations such as restore, write and/or refresh operations pertaining to data state "1", the present inventions are also applicable to other memory operations such as restore, write and/or refresh operations pertaining to data state "0". Accordingly, not only may the controllable parameters be temporal and/or voltage amplitude, the controllable parameters may be applied to one or more operations such as restore, write and/or refresh (whether with respect to data state "1" and/or data state "0").

Indeed, the controllable parameters may be implemented with respect to N-type channel devices/transistors and/or P-type channel devices/transistors. That is, the present inventions (and embodiments thereof) described herein are entirely applicable to P-channel devices/transistors. In such embodiments, majority carriers in the body region are electrons and minority carriers are holes; the voltages applied to the gate may be positive and voltages applied to the source and drain regions may be negative.

Further, all permutations and combinations of the controllable parameter (temporal and voltage), memory operations (restore, write and refresh), data state (logic "1" and logic "0") and type of device (N-channel or P-channel) are intended to fall within the scope of the present inventions. For example, the temporal and/or voltage characteristics may be controlled with respect to the restore operation for data state "1" or data state "0", or both. Moreover, such parameter may be controlled relative to N-type channel, P-type channel, or both. Further, the memory operation with respect to restore data state "0" may be temporally controlled, and the operation with respect to writing data state "0" may be controlled via voltage (voltages applied to the gate, source region, and drain region) relative to another operation (for example, refresh).

Indeed, where the duration of the memory operation is controlled, that duration may be 0 seconds—meaning the memory operation is "skipped" or not executed for one, some or all cycles. For the sake of brevity, as mentioned above, although not discussed in detail herein all permutations and combinations of the controllable parameter (temporal and voltage), program operations (for example, restore, write and refresh), data state (logic "1" and logic "0"), and type of device (N-type channel or P-type channel) are intended to fall within the scope of the present inventions.

The above embodiments of the inventions are merely exemplary. They are not intended to be exhaustive or to limit the inventions to the precise forms, techniques, materials and/or configurations disclosed. Many modifications and variations are possible and it is to be understood that other embodiments may be utilized and operational changes may be made without departing from the scope of the present inventions. The scope of the inventions is not limited solely to the description above because the description of the above embodiments has been presented for the purposes of exemplary illustration/description.

What is claimed is:

1. An integrated circuit device comprising:
a memory cell array having a plurality of dynamic random access memory cells, wherein each dynamic random access memory cell stores at least one data state including a first data state or a second data state;

circuitry, coupled to the memory cell array, to program one or more of the memory cells, wherein the circuitry includes:
  control signal generation circuitry, coupled to the memory cells, to generate control signals, having temporal characteristics, of a first predetermined program operation and a second predetermined program operation; and
  programmable duration circuitry, coupled to the control signal generation circuitry, to control the temporal characteristics of one or more control signals of the first predetermined program operation and the second predetermined program operation; and
wherein the temporal characteristics of the one or more control signals of the first predetermined program operation are different from the temporal characteristics of corresponding control signals of the second predetermined program operation.

2. The integrated circuit device of claim 1 wherein the programmable duration circuitry includes a plurality of circuits including:
  a first circuit to control the temporal characteristics of one or more control signals of a write operation; and
  a second circuit to control the temporal characteristics of one or more control signals of a refresh operation.

3. The integrated circuit device of claim 1 wherein the programmable duration circuitry includes a plurality of circuits including:
  a first circuit to control the temporal characteristics of one or more control signals of a write operation; and
  a second circuit to control the temporal characteristics of one or more control signals of a restore operation.

4. The integrated circuit device of claim 1 wherein the programmable duration circuitry includes a plurality of circuits including:
  a first circuit to control the temporal characteristics of one or more control signals of a write operation;
  a second circuit to control the temporal characteristics of one or more control signals of a refresh operation; and
  a third circuit to control the temporal characteristics of one or more control signals of a restore operation.

5. The integrated circuit device of claim 1 wherein the programmable duration circuitry includes a plurality of RC delay circuits.

6. The integrated circuit device of claim 1 wherein the programmable duration circuitry includes:
  a first register to store a first value which is representative of a temporal characteristic of one or more control signals of a write operation; and
  a second register to store a second value which is representative of a temporal characteristic of one or more control signals of a refresh operation.

7. The integrated circuit device of claim 6 wherein the programmable duration circuitry further includes:
  a multiplexer, coupled to the first and second registers, to responsively output one of the first or second values; and
  a programmable timer, coupled to the multiplexer, to generate a signal that is representative of the temporal characteristics of one or more control signals of the write operation or the refresh operation using the first value or second value, respectively.

8. The integrated circuit device of claim 1 wherein the programmable duration circuitry includes:
  a first register to store a first value which is representative of a temporal characteristic of one or more control signals of a write operation;
  a second register to store a second value which is representative of a temporal characteristic of one or more control signals of a refresh operation; and
  a third register to store a third value which is representative of a temporal characteristic of one or more control signals of a restore operation.

9. The integrated circuit device of claim 8 wherein the programmable duration circuitry further includes:
  a multiplexer, coupled to the first, second and third registers, to responsively output one of the first, second or third values; and
  a programmable timer, coupled to the multiplexer, to generate a signal that is representative of the temporal characteristics of one or more control signals of the write operation, the refresh operation or the restore operation using the first value, second value or third value, respectively.

10. The integrated circuit device of claim 1 wherein the circuitry, coupled to the memory cell array, to program one or more of the memory cells for a plurality of predetermined memory operations, further includes:
  programmable voltage circuitry, coupled to the control signal generation circuitry, to control the voltage amplitude characteristics of one or more control signals of the first predetermined program operation and the second predetermined program operation; and
  wherein the voltage amplitude characteristics of the one or more control signals of the first predetermined program operation are different from the voltage amplitude characteristics of corresponding control signals of the second predetermined program operation.

11. The integrated circuit device of claim 10 wherein the programmable voltage circuitry includes a plurality of circuits including:
  a first circuit to control the voltage amplitude characteristics of one or more control signals of a write operation; and
  a second circuit to control the voltage amplitude characteristics of one or more control signals of a refresh operation.

12. The integrated circuit device of claim 10 wherein the programmable voltage circuitry includes a plurality of circuits including:
  a first circuit to control the voltage amplitude characteristics of one or more control signals of a write operation; and
  a second circuit to control the voltage amplitude characteristics of one or more control signals of a restore operation.

13. The integrated circuit device of claim 10 wherein the programmable voltage circuitry includes a plurality of circuits including:
  a first circuit to control the voltage amplitude characteristics of one or more control signals of a write operation;
  a second circuit to control the voltage amplitude characteristics of one or more control signals of a refresh operation; and
  a third circuit to control the voltage amplitude characteristics of one or more control signals of a restore operation.

14. An integrated circuit device comprising:
  a memory cell array having a plurality of memory cells, wherein each dynamic random access memory cell stores at least one data state including a first data state or a second data state;
  circuitry, coupled to the memory cell array, to program one or more of the memory cells, wherein the circuitry includes:

control signal generation circuitry, coupled to the memory cells, to generate control signals, having voltage amplitude characteristics, of a first predetermined program operation and a second predetermined program operation; and programmable voltage circuitry, coupled to the control signal generation circuitry, to control the voltage amplitude characteristics of one or more control signals of the first predetermined program operation and the second predetermined program operation; and wherein the voltage amplitude characteristics of the one or more control signals of the first predetermined program operation are different from the voltage amplitude characteristics of corresponding control signals of the second predetermined program operation.

15. The integrated circuit device of claim 14 wherein the programmable voltage circuitry includes a plurality of circuits including:
   a first circuit to control the voltage amplitude characteristics of one or more control signals of a write operation; and
   a second circuit to control the voltage amplitude characteristics of one or more control signals of a refresh operation.

16. The integrated circuit device of claim 14 wherein the programmable voltage circuitry includes a plurality of circuits including:
   a first circuit to control the voltage amplitude characteristics of one or more control signals of a write operation; and
   a second circuit to control the voltage amplitude characteristics of one or more control signals of a restore operation.

17. The integrated circuit device of claim 14 wherein the programmable voltage circuitry includes a plurality of circuits including:
   a first circuit to control the voltage amplitude characteristics of one or more control signals of a write operation;
   a second circuit to control the voltage amplitude characteristics of one or more control signals of a refresh operation; and
   a third circuit to control the voltage amplitude characteristics of one or more control signals of a restore operation.

18. The integrated circuit device of claim 14 wherein the programmable voltage circuitry includes:
   a first register to store a first value which is representative of a voltage amplitude characteristic of one or more control signals of a write operation; and
   a second register to store a second value which is representative of a voltage amplitude characteristic of one or more control signals of a refresh operation.

19. The integrated circuit device of claim 14 wherein the programmable duration circuitry includes:
   a first register to store a first value which is representative of a voltage amplitude characteristic of one or more control signals of a write operation;
   a second register to store a second value which is representative of a voltage amplitude characteristic of one or more control signals of a refresh operation; and
   a third register to store a third value which is representative of a voltage amplitude characteristic of one or more control signals of a restore operation.

20. The integrated circuit device of claim 14 wherein:
   the circuitry to program one or more of the memory cells is means for programming one or more of the memory cells, and wherein:
      the control signal generation circuitry is means for generating control signals, having voltage amplitude characteristics, of a first predetermined program operation and a second predetermined program operation, and
      the programmable voltage circuitry is means for controlling the voltage amplitude characteristics of one or more control signals of the first predetermined program operation and the second predetermined program operation.

21. The integrated circuit device of claim 1 wherein:
   the circuitry to program one or more of the memory cells is means for programming one or more of the memory cells, and wherein:
      the control signal generation circuitry is means for generating control signals, having temporal characteristics, of a first predetermined program operation and a second predetermined program operation, and
      the programmable duration circuitry is means for controlling the temporal characteristics of one or more control signals of the first predetermined program operation and the second predetermined program operation.

* * * * *